US011061338B2

(12) United States Patent
Wells et al.

(10) Patent No.: US 11,061,338 B2
(45) Date of Patent: Jul. 13, 2021

(54) HIGH-RESOLUTION POSITION ENCODER WITH IMAGE SENSOR AND ENCODED TARGET PATTERN

(71) Applicant: NIKON CORPORATION, Tokyo (JP)

(72) Inventors: Jonathan Kyle Wells, San Francisco, CA (US); Paul Derek Coon, Redwood City, CA (US); Matthew D. Rosa, Tokyo (JP); Johnathan Marquez, San Diego, CA (US); Michael B. Binnard, Belmont, CA (US); Steven Douglas Slonaker, San Mateo, CA (US); Daniel Gene Smith, Tucson, AZ (US); Stephen P. Renwick, Moss Beach, CA (US); Brett Herr, Menlo Park, CA (US)

(73) Assignee: NIKON CORPORATION

(*) Notice: Subject to any disclaimer, the term of this patent is extended or adjusted under 35 U.S.C. 154(b) by 0 days.

(21) Appl. No.: 15/940,549

(22) Filed: Mar. 29, 2018

(65) Prior Publication Data
US 2018/0217510 A1    Aug. 2, 2018

Related U.S. Application Data

(63) Continuation-in-part of application No. 15/669,661, filed on Aug. 4, 2017, now Pat. No. 10,884,344, and
(Continued)

(51) Int. Cl.
*G03F 7/20* (2006.01)
*H02K 41/03* (2006.01)
(Continued)

(52) U.S. Cl.
CPC ......... *G03F 7/70725* (2013.01); *G01D 5/347* (2013.01); *G01D 5/34715* (2013.01);
(Continued)

(58) Field of Classification Search
CPC .......... G01D 5/26; G01D 5/266; G01D 5/344; G01D 5/345; G01D 5/347; G01D 5/34707;
(Continued)

(56) References Cited

U.S. PATENT DOCUMENTS

| | | | | |
|---|---|---|---|---|
| 5,442,166 A | * | 8/1995 | Hollmann | G01D 5/34 250/201.1 |
| 5,604,345 A | * | 2/1997 | Matsuura | G01D 5/366 250/231.16 |

(Continued)

OTHER PUBLICATIONS

Office Action issued by the U.S. Patent Office, dated Jul. 1, 2019, in U.S. Appl. No. 15/669,661, related matter.
(Continued)

*Primary Examiner* — Christina A Riddle
(74) *Attorney, Agent, or Firm* — Roeder & Broder LLP; Steven G. Roeder

(57) ABSTRACT

A position encoder for monitoring position of an object includes a target pattern, an illumination system, an image sensor, and a control system. The illumination system generates (i) a first illumination beam that is directed toward and impinges on the target pattern, the first illumination beam having a first beam characteristic; and (ii) a second illumination beam that is directed toward and impinges on the target pattern, the second illumination beam having a second beam characteristic that is different than the first beam characteristic. The image sensor is coupled to the object and is spaced apart from the target pattern. The image sensor senses a first set of information from the first illumination beam impinging on the target pattern and senses a second set of information from the second illumination beam impinging on the target pattern. The control system analyzes the first set of information and the second set of information to monitor the position of the object.

44 Claims, 10 Drawing Sheets

Related U.S. Application Data a continuation-in-part of application No. 15/264,108, filed on Sep. 13, 2016, now Pat. No. 10,812,695, said application No. 15/669,661 is a continuation of application No. 14/689,570, filed on Apr. 17, 2015, now Pat. No. 9,726,987.

(60) Provisional application No. 62/553,099, filed on Aug. 31, 2017, provisional application No. 62/479,183, filed on Mar. 30, 2017, provisional application No. 62/218,479, filed on Sep. 14, 2015, provisional application No. 62/033,771, filed on Aug. 6, 2014, provisional application No. 61/980,920, filed on Apr. 17, 2014.

(51) Int. Cl.
  *G01D 5/347* (2006.01)
  *G03F 9/00* (2006.01)

(52) U.S. Cl.
  CPC ........ *G03F 7/7085* (2013.01); *G03F 7/70341* (2013.01); *G03F 7/70716* (2013.01); *G03F 7/70775* (2013.01); *G03F 9/7026* (2013.01); *G03F 9/7034* (2013.01); *G03F 9/7049* (2013.01); *H02K 41/031* (2013.01); *H02K 2201/18* (2013.01)

(58) Field of Classification Search
  CPC ............. G01D 5/3473; G01D 5/34746; G01D 5/34776; G01D 5/34784; G01D 5/34792; G01D 5/34715; G03F 7/70725; G03F 7/70341; G03F 7/70716; G03F 7/70775; G03F 7/7085; G03F 7/70758; G03F 7/7095; G03F 7/70958; G03F 9/7065; G03F 9/7073; G03F 9/7076; G03F 9/7092; G03F 9/7026; G03F 9/7034; G03F 9/7049; H02K 41/031; H02K 2201/18
  USPC ....... 356/488, 486, 498, 499, 521, 614–624, 356/399–401; 355/30, 52–55, 67–77
  See application file for complete search history.

(56) References Cited

U.S. PATENT DOCUMENTS

| | | | |
|---|---|---|---|
| 5,698,861 A | 12/1997 | Oh | |
| 5,925,956 A | 7/1999 | Ohzeki | |
| 6,094,269 A | 7/2000 | Ben-Dove et al. | |
| 6,249,591 B1 | 6/2001 | Tullis | |
| 6,570,104 B1 | 5/2003 | Ericson et al. | |
| 6,621,063 B2 | 9/2003 | McQueen | |
| 6,765,195 B1 * | 7/2004 | Leviton | G01D 5/347 250/231.13 |
| 6,963,074 B2 | 11/2005 | McQueen | |
| 7,295,947 B2 | 11/2007 | Kurth et al. | |
| 7,608,813 B1 * | 10/2009 | Milvich | G01D 5/34784 250/231.13 |
| 7,617,070 B2 | 11/2009 | Kurth et al. | |
| 7,907,795 B2 | 3/2011 | Hardy et al. | |
| 7,999,841 B1 | 8/2011 | Stevens | |
| 9,726,987 B2 | 8/2017 | Coon et al. | |
| 2002/0079466 A1 * | 6/2002 | Talmi | G01D 5/347 250/559.1 |
| 2004/0130691 A1 | 7/2004 | Boonman | |
| 2005/0211885 A1 | 9/2005 | Tobiason et al. | |
| 2006/0043272 A1 * | 3/2006 | Mayer | G01D 5/347 250/231.13 |
| 2006/0055912 A1 | 3/2006 | Kurth | |
| 2007/0229788 A1 | 10/2007 | Kosugi | |
| 2007/0246646 A1 | 10/2007 | Lum | |
| 2008/0291470 A1 * | 11/2008 | Yun | G01B 11/002 356/616 |
| 2009/0012743 A1 | 1/2009 | McDonnell | |
| 2009/0268210 A1 * | 10/2009 | Prince | G01D 5/347 356/494 |
| 2010/0020180 A1 | 1/2010 | Hill et al. | |
| 2010/0157276 A1 | 6/2010 | Shibazaki | |
| 2011/0164238 A1 | 7/2011 | Yoshimoto | |
| 2011/0255096 A1 * | 10/2011 | Deck | G01D 5/266 356/488 |
| 2011/0267594 A1 | 11/2011 | Kim et al. | |
| 2012/0007980 A1 * | 1/2012 | Gordon-Ingram | G01D 5/34715 348/135 |
| 2013/0141715 A1 | 6/2013 | Urano et al. | |
| 2014/0049762 A1 * | 2/2014 | Goodwin | G01B 11/14 355/72 |
| 2014/0168625 A1 | 6/2014 | Ito | |
| 2014/0204358 A1 | 7/2014 | Yang et al. | |
| 2014/0232846 A1 | 8/2014 | Tanaka | |
| 2014/0368804 A1 | 12/2014 | Lafarre et al. | |
| 2015/0241525 A1 | 8/2015 | Yang et al. | |
| 2015/0301459 A1 | 10/2015 | Coon et al. | |
| 2017/0076439 A1 | 3/2017 | Wells et al. | |
| 2017/0329236 A1 | 11/2017 | Coon et al. | |

OTHER PUBLICATIONS

Office Action dated Oct. 1, 2018 by the U.S. Patent Office in U.S. Appl. No. 15/669,661. (Related matter).

Office Action dated Oct. 23, 2018 by the U.S. Patent Office in U.S. Appl. No. 15/264,108. (Related matter).

"How do optical mice work?" May 8, 2001. HowStuffWorks.com. <http://computer.howstuffworks.com/question631.htm>. The applicant admits that optical mice are prior art.

Microsoft wireless laser mouse 7000 specifications: http://www.microsoft.com/hardware/en-us/d/wireless-laser-mouse-7000. The applicant admits that optical mice are prior art.

Office Action issued by the U.S. Patent Office, dated Apr. 7, 2020, in U.S. Appl. No. 15/669,661. This application is related to the instant application.

* cited by examiner

A: Image at t=0ms

B: Image at t=0.67ms

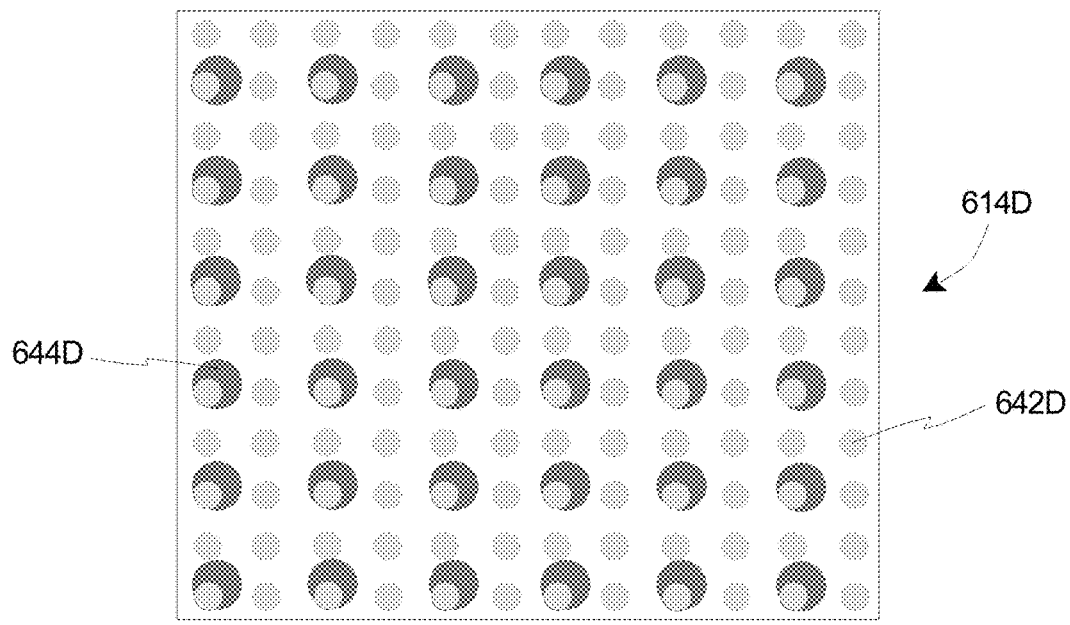
Fig. 6D
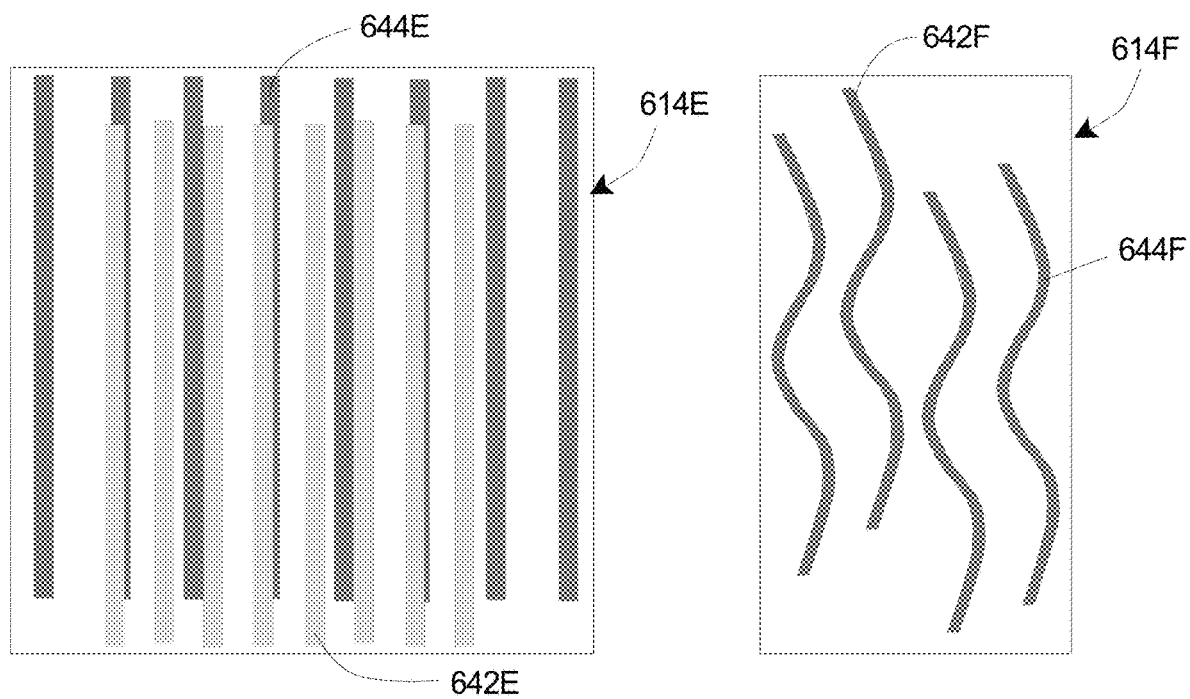
Fig. 6E
Fig. 6F

HIGH-RESOLUTION POSITION ENCODER WITH IMAGE SENSOR AND ENCODED TARGET PATTERN

RELATED APPLICATIONS

This application is a continuation-in-part of U.S. patent application Ser. No. 15/669,661, entitled "POSITIONING SYSTEM USING SURFACE PATTERN RECOGNITION AND INTERPOLATION", and filed on Aug. 4, 2017. Additionally, U.S. patent application Ser. No. 15/669,661 is a continuation application of U.S. patent application Ser. No. 14/689,570, entitled "POSITIONING SYSTEM USING SURFACE PATTERN RECOGNITION AND INTERPOLATION", and filed on Apr. 17, 2015, which is now U.S. Pat. No. 9,726,987 B2, which issued on Aug. 8, 2017. Further, U.S. patent application Ser. No. 14/689,570 (now U.S. Pat. No. 9,726,987 B2) claims priority on U.S. Provisional Application Ser. No. 61/980,920 filed on Apr. 17, 2014, and entitled "OPTICAL SENSOR SYSTEM FOR SERVO CONTROL OF A MOVER"; and U.S. Provisional Application Ser. No. 62/033,771 filed on Aug. 6, 2014, and entitled "POSITIONING SYSTEM USING SURFACE PATTERN RECOGNITION AND INTERPOLATION". As far as permitted, the contents of U.S. patent application Ser. No. 15/669,661, U.S. Pat. No. 9,726,987 B2, and U.S. Provisional Application Ser. Nos. 61/980,920 and 62/033,771, are incorporated in their entirety herein by reference.

Additionally, this application is also a continuation-in-part of U.S. patent application Ser. No. 15/264,108, entitled "THREE-DIMENSIONAL POSITIONING SYSTEM USING SURFACE PATTERN RECOGNITION AND INTERPOLATION", and filed on Sep. 13, 2016. Further, U.S. patent application Ser. No. 15/264,108 claims priority on U.S. Provisional Application Ser. No. 62/218,479, entitled "THREE-DIMENSIONAL POSITIONING SYSTEM USING SURFACE PATTERN RECOGNITION AND INTERPOLATION", filed on Sep. 14, 2015. As far as permitted, the contents of U.S. patent application Ser. No. 15/264,108, and U.S. Provisional Application Ser. No. 62/218,479, are incorporated in their entirety herein by reference.

Further, this application also claims priority on U.S. Provisional Application Ser. No. 62/479,183 filed on Mar. 30, 2017, and entitled "HIGH RESOLUTION POSITION ENCODER WITH IMAGING SENSOR"; and U.S. Provisional Application Ser. No. 62/553,099 filed on Aug. 31, 2017, and entitled "HIGH RESOLUTION POSITION ENCODER WITH IMAGING SENSOR AND ENCODED TARGET PATTERN". As far as permitted, the contents of U.S. Provisional Application Ser. Nos. 62/479,183, and 62/553,099, are incorporated in their entirety herein by reference.

BACKGROUND

Sensor systems, such as position encoders, are used to measure position or monitor movement of an object. In general, currently available position encoders fall into three primary categories, (i) low-cost, low-resolution encoders, (ii) high-cost, high-resolution encoders, and (iii) image correlation sensors. Unfortunately, currently available position encoders are not entirely satisfactory for all intended uses. For example, low-cost, low-resolution encoders typically use simple on-off shadowing for detecting position or movement of the object. These systems can suffer from measurement drift, low accuracy, lack of repeatability and other disadvantages. Additionally, high-cost, high-resolution encoders typically use precision linear scales and measure position using diffraction, interferometry and/or simple photodetectors. While such systems can offer high-resolution and high-accuracy, they can also be cost-prohibitive, as well as tending to have tight optical alignment requirements and allowing little cross-axis motion. Further, image correlation sensors such as are used on optical mice and other specialized applications use correlation methods to determine motion of the sensor relative to an unstructured surface. These systems can suffer from measurement drift, limited velocity, low accuracy, lack of repeatability, and other disadvantages.

SUMMARY

The present invention is directed toward a position encoder for monitoring position of an object. In various embodiments, the position encoder includes a target pattern, an illumination system, an image sensor, and a control system. The illumination system generates (i) a first illumination beam that is directed toward and impinges on the target pattern, the first illumination beam having a first beam characteristic; and (ii) a second illumination beam that is directed toward and impinges on the target pattern, the second illumination beam having a second beam characteristic that is different than the first beam characteristic. The image sensor is coupled to the object. The image sensor is spaced apart from the target pattern. The image sensor senses a first set of information from the first illumination beam impinging on the target pattern and senses a second set of information from the second illumination beam impinging on the target pattern. The control system analyzes the first set of information and the second set of information to monitor the position of the object.

As provided herein, each of the target pattern, the illumination system, the image sensor assembly and the control system can be varied in many alternative manners so that the position encoder can more effectively and efficiently monitor the position of the object.

In some embodiments, the target pattern includes a plurality of first pattern elements that are reflective to the first illumination beam; and a plurality of second pattern elements that are reflective to the second illumination beam. Additionally, in certain such embodiments, the plurality of first pattern elements are not reflective to the second illumination beam; and the plurality of second pattern elements are not reflective to the first illumination beam.

In one embodiment, the first beam characteristic is a first wavelength, and the second beam characteristic is a second wavelength that is different than the first wavelength. In another embodiment, the first beam characteristic is a first polarization, and the second beam characteristic is a second polarization that is different than the first polarization.

Additionally, in certain embodiments, the illumination system includes a first illumination source that generates the first illumination beam and a second illumination source that generates the second illumination beam. In some such embodiments, at least one of the first illumination source and the second illumination source includes an LED.

Further, in some embodiments, the image sensor includes a two-dimensional array of detector elements arranged in a plurality of detector rows and a plurality of detector columns. In some such embodiments, the image sensor (i) senses information for each of the detector elements from the first illumination beam impinging on the target pattern, the image sensor individually summing the information for each of the plurality of detector columns to generate a plurality of first summed column outputs, and the image sensor individually summing the information for each of the plurality of detector rows to generate a plurality of first summed row outputs; and (ii) senses information for each of the detector elements from the second illumination beam impinging on the target pattern, the image sensor individually summing the information for each of the plurality of detector columns to generate a plurality of second summed column outputs, and the image sensor individually summing the information for each of the plurality of detector rows to generate a plurality of second summed row outputs. Additionally, in certain embodiments, the control system analyzes the first summed column outputs, the first summed row outputs, the second summed column outputs and the second summed row outputs to monitor the position of the object. For example, in one such embodiment, the control system includes an algorithm that is configured to determine a phase of each of the first summed column outputs, the first summed row outputs, the second summed column outputs and the second summed row outputs to monitor the position of the object.

Additionally, the present invention is further directed toward a position encoder for monitoring position of an object, the position encoder including (A) a target pattern; (B) an illumination system that generates an illumination beam that is directed toward and impinges on the target pattern; (C) an image sensor that is coupled to the object, the image sensor being spaced apart from the target pattern, the image sensor including a two-dimensional array of detector elements arranged in a plurality of detector columns and a plurality of detector rows, the image sensor sensing information for each of the detector elements from the illumination beam impinging on the target pattern, the image sensor individually summing the information for each of the plurality of detector columns to generate a plurality of summed column outputs, and the image sensor individually summing the information for each of the plurality of detector rows to generate a plurality of summed row outputs; and (D) a control system that analyzes the summed column outputs and the summed row outputs to monitor the position of the object.

Further, in certain applications, the present invention is also directed toward a position encoder for monitoring position of an object, the position encoder including (A) a target pattern including a plurality of first pattern elements that are arranged in a first pattern, and a plurality of second pattern elements that are arranged in a second pattern that is different than the first pattern; (B) an illumination system that generates an illumination beam that is directed toward and impinges on the target pattern; (C) an image sensor that is coupled to the object, the image sensor being spaced apart from the target pattern, the image sensor including a plurality of column detector elements and a plurality of row detector elements, the image sensor sensing a first set of information from the illumination beam impinging on the plurality of first pattern elements and senses a second set of information from the illumination beam impinging on the plurality of second pattern elements; and (D) a control system that analyzes the first set of information and the second set of information to monitor the position of the object.

Still further, in yet other applications, the present invention is directed toward a position encoder for monitoring position of an object, the position encoder including (A) a target pattern; (B) an illumination system that generates an illumination beam that is directed toward and impinges on the target pattern; (C) an image sensor that is coupled to the object, the image sensor being spaced apart from the target pattern, the image sensor including a two-dimensional array of detector elements arranged in a plurality of detector columns and a plurality of detector rows, the image sensor sensing information for each of the detector elements from the illumination beam impinging on the target pattern; and (D) a control system that individually sums the information for each of the plurality of detector columns to generate a plurality of summed column outputs, and individually sums the information for each of the plurality of detector rows to generate a plurality of summed row outputs, the control system analyzing the summed column outputs and the summed row outputs to monitor the position of the object.

In certain alternative embodiments, the position encoder can be configured to include an image sensor including a one-dimensional array of detector elements arranged in a single detector column and a plurality of detector rows.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 6D is a simplified schematic illustration of a portion of another embodiment of the target pattern;

FIG. 6E is a simplified schematic illustration of a portion of yet another embodiment of the target pattern;

FIG. 6F is a simplified schematic illustration of a portion of still yet another embodiment of the target pattern;

DESCRIPTION

Embodiments of the present invention are described herein in the context of a position encoder that utilizes an image sensor in conjunction with an encoded target pattern to provide high-resolution position detection of an object at a relatively low cost. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application-related and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1A:
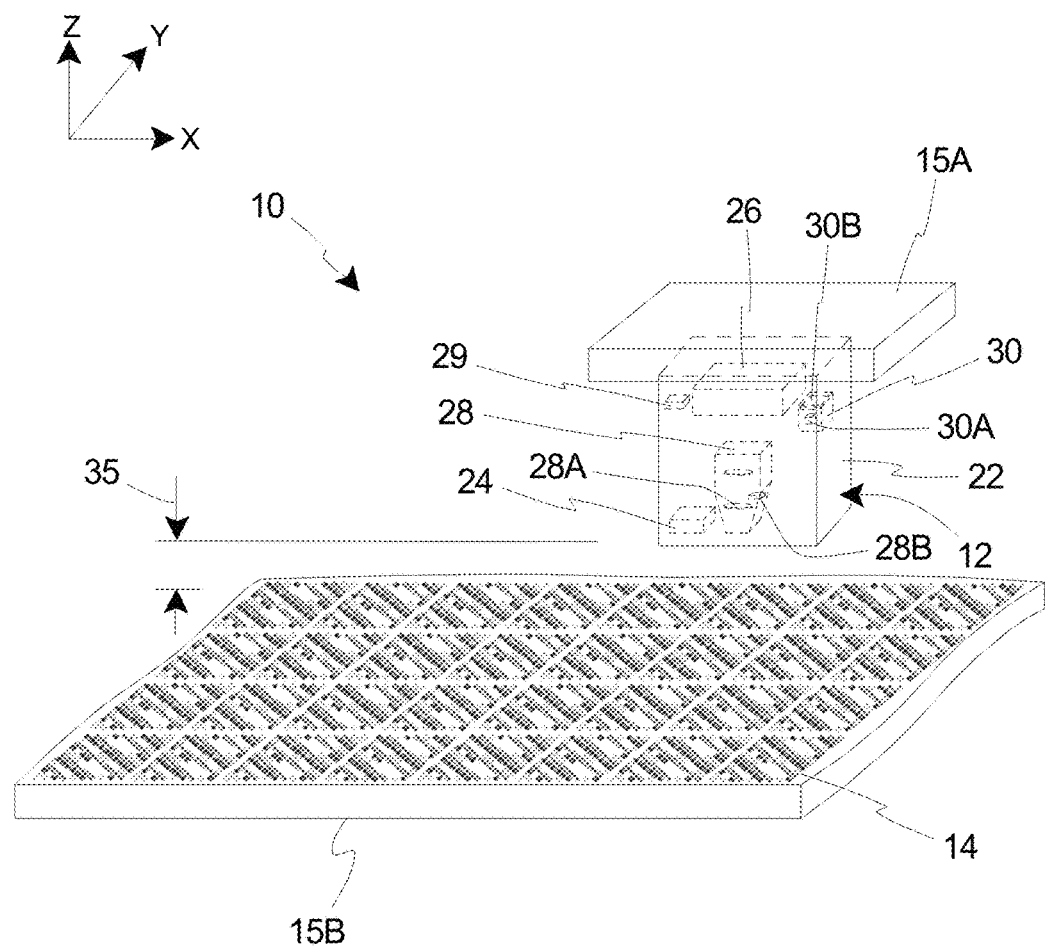
FIG. 1A is a simplified perspective view illustration of an embodiment of a position encoder having features of the present invention, the position encoder including an image sensor assembly and a target pattern.

FIG. 1A is a simplified perspective view illustration of an embodiment of a position encoder 10 having features of the present invention. As illustrated, in various embodiments, the position encoder 10 can include an image sensor assembly 12 and a target pattern 14. As provided in detail herein, the design of the image sensor assembly 12 and the target pattern 14 can be varied to suit the specific requirements and intended usages of the position encoder 10. Further, as shown, the image sensor assembly 12 can be coupled or otherwise attached to a first object 15A, and the target pattern 14 can be coupled to or otherwise attached to a second object 15B. With such design, the position encoder 10 can be utilized to monitor relative position and/or movement between the first object 15A and the second object 15B. Still further, as shown in this embodiment, the image sensor assembly 12, and the various components contained therein, is spaced apart from the target pattern 14 along an axis, e.g., along the Z axis as shown in FIG. 1A.

It is understood that the first object 15A and the second object 15B can be any suitable objects. For example, in some embodiments, the first object 15A can be a motorized cart that is configured to move relative to the second object 15B and the target pattern 14. Additionally, in some applications, the second object 15B can be quite large, e.g., a large industrial flooring area, and the target pattern 14 can be configured to be coupled to or formed into most if not all of the second object 15B. Thus, it is appreciated that only a portion of the second object 15B and a portion of the target pattern 14 are illustrated in FIG. 1A for purposes of clarity and ease of illustration.

Some of the Figures provided herein include an orientation system that designates an X axis, a Y axis that is orthogonal to the X axis, and a Z axis that is orthogonal to the X and Y axes. In these Figures, the Z axis is oriented in the vertical direction. It should be understood that the orientation system is merely for reference and can be varied. For example, the X axis can be switched with the Y axis. Moreover, it should be noted that any of these axes can also be referred to as a first, a second, and/or a third axis.

In certain applications, the incremental position and/or movement of the first object 15A can be monitored by the position encoder 10 relative to a particular reference, e.g., to the second object 15B or another suitable reference. Alternatively, in other applications, the absolute position of the first object 15A and the incremental movement of the first object 15A can be monitored by the position encoder 10 relative to the reference. Still alternatively, the absolute position of the second object 15B and/or the incremental movement of the second object 15B can be monitored by the position encoder 10 relative to a reference, e.g., the first object 15A or another suitable reference.

Additionally, it is appreciated that the position encoder 10 can be utilized in many alternative manners. For example, in certain applications, the position encoder 10 can be used as a standalone device for measuring or monitoring the position or movement of one of the objects 15A, 15B. Alternatively, in other applications, the position encoder 10 can be used as part of a stage assembly 816 (illustrated in FIG. 8) including a stage 818 (illustrated in FIG. 8) that retains a device 820 (illustrated in FIG. 8), for measuring or monitoring the position or movement of the stage 818 and the device 820, e.g., relative to a reference. Still alternatively, in still other applications, the position encoder 10 can be used in another suitable manner for measuring or monitoring the position or relative movement between the two objects 15A, 15B.

It is further appreciated that the position encoder 10 of the present invention can be incorporated into various alternative configurations. For example, as provided herein, the position encoder 10 can be alternatively configured to operate as (i) a one-dimensional linear encoder (e.g., along the X axis or along the Y axis), (ii) a two-dimensional linear encoder (e.g., along the X axis and along the Y axis), (iii) a three-dimensional linear encoder (e.g. along the X axis, along the Y axis, and along the Z axis), and (iv) a rotary encoder using a two-dimensional sensor that would allow for measurement of rotational angle and circular runout (see e.g., FIG. 1B). Additionally, for both use as a linear encoder or a rotary encoder, the position encoder 10 can be configured as an absolute sensor or as an incremental sensor. Further, the position encoder 10 can also be an incremental sensor with periodic reference or home positions encoded into the target pattern 14.

As noted, the design of the image sensor assembly 12 can be varied. For example, in various embodiments, as shown in FIG. 1A, the image sensor assembly 12 can include a sensor head 22, an illumination system 24 (illustrated in phantom), an image sensor 26 (illustrated in phantom), an optical system 28 (illustrated in phantom), an electronic memory 29 (illustrated in phantom), and a control system 30 (illustrated in phantom). Alternatively, the image sensor assembly 12 can include more components or fewer components than those specifically illustrated and described in relation to FIG. 1A.

As an overview, the problem of providing a low-cost, high-resolution position encoder with wide tolerances for alignment and cross-axis motion is solved by using the image sensor assembly 12 including the optical system 28 to image a predefined and specially encoded target pattern 14 onto the image sensor 26. The type of measurement enabled through the use of the position encoder 10 offers an excellent tradeoff between cost, accuracy and ease of installation and use. Additionally, unlike a diffraction-based measurement system, embodiments of the position encoder 10 disclosed herein offer much looser alignment requirements and a more reasonable cost. Further, the position encoder 10 of the present invention is capable of determining position to the micron level, and does not require extensive calibration. Still further, in some embodiments, the position encoder 10 can provide such advantages while also enabling advancements in tracking speed, accuracy and resolution, and while limiting processing time and complexity.

As illustrated, the sensor head 22 provides a housing for the other components of the image sensor assembly 12. More particularly, as shown, in certain embodiments, the illumination system 24, the image sensor 26, the optical system 28, the electronic memory 29 and the control system 30 can be positioned and retained substantially within the sensor head 22. Alternatively, one or more components of the image sensor assembly 12 can be positioned remotely from the sensor head 22. For example, in one non-exclusive alternative embodiment, the control system 30 can be included and positioned remotely from the sensor head 22.

The size, shape and design of the sensor head 22 can be varied. For example, in certain embodiments, the sensor head 22 is substantially rectangular box-shaped. Alternatively, the sensor head 22 can have another suitable shape.

During use of the position encoder 10, the illumination system 24 is configured and oriented to generate an illumination beam and direct the illumination beam toward the target pattern 14. The illumination beam includes a plurality of rays. Additionally, the illumination beam is directed from the illumination system 24 so as to impinge on the target pattern 14.

The design of the illumination system 24 can be varied. For example, in the embodiment illustrated in FIG. 1A, the illumination system 24 can include a light emitting diode ("LED"), a laser, or another suitable type of illumination system that directs the illumination beam toward the target pattern 14 to illuminate the target pattern 14. Further, in various applications, the illumination system 24 can be used in a pulsed manner to inhibit image blur that may otherwise be present if utilizing a continuous illumination system.

Alternatively, in certain embodiments, the illumination system 24 can be configured to generate a plurality of illumination beams, e.g., two illumination beams, that are directed toward the target pattern 14. In some such embodiments, each of the plurality of illumination beams can be generated from a separate illumination source. In other such embodiments, a single illumination source can be utilized to generate an illumination beam that is split, e.g., with a beam splitter, in order to provide the plurality of illumination beams that are directed toward the target pattern 14.

The image sensor 26 is configured for capturing, sensing, detecting and/or recording one or more images of the target pattern 14. In certain embodiments, the image sensor 26 can be an optoelectronic sensor (essentially, a tiny low-resolution video camera) that includes a two-dimensional array of pixels (or detector elements) that records light electronically. Stated in another manner, in such embodiments, the image sensor 26 can be said to include a plurality of detector columns and a plurality of detector rows. More specifically, the image sensor 26 can be configured to sense information from the illumination beam(s) being directed toward and impinging on the target pattern 14. As utilized herein, the image sensor 26 being said to "capture" an image of the target pattern 14 refers to the image sensor 26 capturing/sensing information or data points from the illumination beam impinging on the target pattern 14 that can be used to generate an image or image profile of the target pattern 14.

With the design noted above, the image sensor 26 can sense light intensity information and thus effectively "capture" successive, two-dimensional images of the target pattern 14 as the image sensor assembly 12, i.e. the sensor head 22 and/or the image sensor 26, and the target pattern 14 are moved relative to one another. Stated in another fashion, the image sensor assembly 12 captures multiple successive images at regular intervals (e.g., thousands of images per second). Depending on the speed of the relative movement between the image sensor assembly 12 and the target pattern 14, each image will be offset from the previous one by a fraction of a pixel or as many as several pixels. In one, non-exclusive embodiment, the image sensor assembly 12 has (i) a tracking speed=0.914 m/sec; (ii) an imaging rate=6000 frames per second; and (iii) a resolution=39.38 points per millimeter. Additionally, in certain embodiments, the image sensor assembly 12 can have a measuring area of between approximately 610 microns by 914 microns, and an accuracy of ±5 microns. Alternatively, the image sensor assembly 12 can have different specifications.

Still alternatively, as provided herein, in some embodiments, the image sensor 26 need not sense multiple sets of information or capture successive images of the target pattern 14 for purposes of the position encoder 10 effectively monitoring the relative position between the image sensor assembly 12 and the target pattern 14. For example, in certain embodiments, the target pattern 14 can be encoded with a unique pattern such that an absolute position of the image sensor assembly 12 can be determined with only a single set of information being sensed or a single image being captured by the image sensor 26.

The optical system 28 is configured to direct and focus light from the illumination system 24 that is reflected off of the target pattern 14 onto the image sensor 26. In some embodiments, the optical system 28 can include one or more lenses or mirrors that direct and focus light from the illumination system 24 that is reflected off of the target pattern 14 onto the image sensor 26. For example, in one non-exclusive embodiment, the optical system 28 includes a pair of lenses 28A (illustrated in phantom) that direct and focus light from the target pattern 14 onto the image sensor 26. Additionally, the optical system 28 can further include an optical mover assembly 28B (illustrated in phantom) that is configured to selectively move one or more of the lenses 28A to better focus light from the target pattern 14 onto the image sensor 26. Alternatively, the optical system 28 can have another suitable design.

The electronic memory 29 is configured to store and retain any electronic data and information that may be required for effective use of the position encoder 10. For example, the electronic memory 29 can be utilized to retain the various images of the target pattern 14 that are captured through use of the image sensor 26 during use of the position encoder 10. As provided herein, the previously captured images of the target pattern 14 can be utilized as a point of reference to determine subsequent relative movement between the image sensor assembly 12 and the target pattern 14, and/or between the first object 15A and the second object 15B.

The control system 30 is configured to control the operation of the image sensor assembly 12 and/or the position encoder 10. For example, in certain embodiments, the control system 30 can analyze successive images captured by the image sensor 26 to effectively monitor the position and movement of image sensor assembly 12, i.e. the image sensor 26 (and thus the first object 15A) relative to the target pattern 14 (and thus the second object 15B). Additionally or alternatively, in other embodiments, in the event the target pattern 14 includes unique features, the control system 30 can analyze a single image or multiple images to determine absolute position. The control system 30 can include one or more processors 30A and one or more circuit boards 30B, and can be programmed to perform one or more of the steps provided herein.

During use of the position encoder 10, at least a portion of the target pattern 14 is configured to be reflective to the illumination beam(s) that are directed at the target pattern 14 from the illumination system 24. As utilized herein, the target pattern 14, or any portions thereof, is said to be "reflective" to the illumination beam if the target pattern 14, or portions thereof, reflect between at least approximately sixty percent and one hundred percent of the rays of the illumination beam. In particular, in certain non-exclusive embodiments, the target pattern 14 is said to be "reflective" to the illumination beam if the target pattern 14 reflects at least approximately sixty percent, sixty-five percent, seventy percent, seventy-five percent, eighty percent, eighty-five percent, ninety percent, ninety-five percent, or one hundred percent of the rays of the illumination beam. Conversely, as utilized herein, the target pattern 14, or any portions thereof, is said to be less reflective (or not reflective) to the illumination beam if the target pattern 14, or portions thereof, reflect between less than approximately forty percent of the illumination beam. For example, in certain non-exclusive embodiments, the target pattern 14 is said to be less reflective (or not reflective) to the illumination beam if the target pattern 14 reflects less than approximately forty percent, thirty-five percent, thirty percent, twenty-five percent, twenty percent, fifteen percent, ten percent or five percent of the illumination beam, or reflects none (zero percent) of the illumination beam.

As provided in greater detail herein below, the target pattern 14 can have any suitable design and can be encoded with information in differing amounts and manners for purposes of effectively analyzing images to detect position and movement between the image sensor assembly 12 and the target pattern 14. It is appreciated that the encoding of additional information into the target pattern 14 can be accomplished in any suitable manner. For example, as shown in the embodiment illustrated in FIG. 1A, the target pattern 14 can be periodic or repeating in both planar dimensions and can be extended across wide areas and in any shape. Additionally and/or alternatively, the target pattern 14 can include non-repeating pattern elements. Further, the target pattern 14 can incorporate other encoding elements. For example, in certain other non-exclusive alternative embodiments, the target pattern 14 can include (i) high-contrast elements (e.g., contrasting between black elements and white elements); (ii) elements of multiple different colors or elements have multiple different grayscale values; (iii) elements that are reflective to multiple different polarizations from the illumination system 24; (iv) overlapping Vernier elements; (v) elements including different degrees of line pattern wobble (e.g., more or less curvature in the individual pattern elements); and (vi) multiple patterned tiles or multiple individual patterns that can be spaced apart from one another.

It is appreciated that with the numerous possible variations that may be encoded into the target pattern 14, the control system 30 will similarly be configured, e.g., with particularly designed algorithms, to capitalize on the information that is encoded within the target pattern 14 to more completely, efficiently and effectively monitor and measure the relative (or absolute) position and movement between the image sensor assembly 12 and the target pattern 14.

In certain applications, manufacturing of the target pattern 14 can be done in a printed circuit board fabrication facility. In particular, in such applications, the target pattern 14 can be printed using a high-precision optical process such as used to create printed circuit boards. It is understood that using such methods can provide a cost-effective solution compared to traditional encoder scales. In addition, the measuring area is only limited by the printed circuit board manufacturer's current technology. Thus, custom patterns and custom outlines can be produced very cheaply and in any quantity desired. Further, in alternative embodiments, the target pattern 14 can be printed on either a rigid substrate (e.g., fiberglass board) or a flexible substrate (e.g., polyimide film). In certain embodiments, the target pattern 14 is made of a material having a relatively low coefficient of thermal expansion.

Figure 1B:
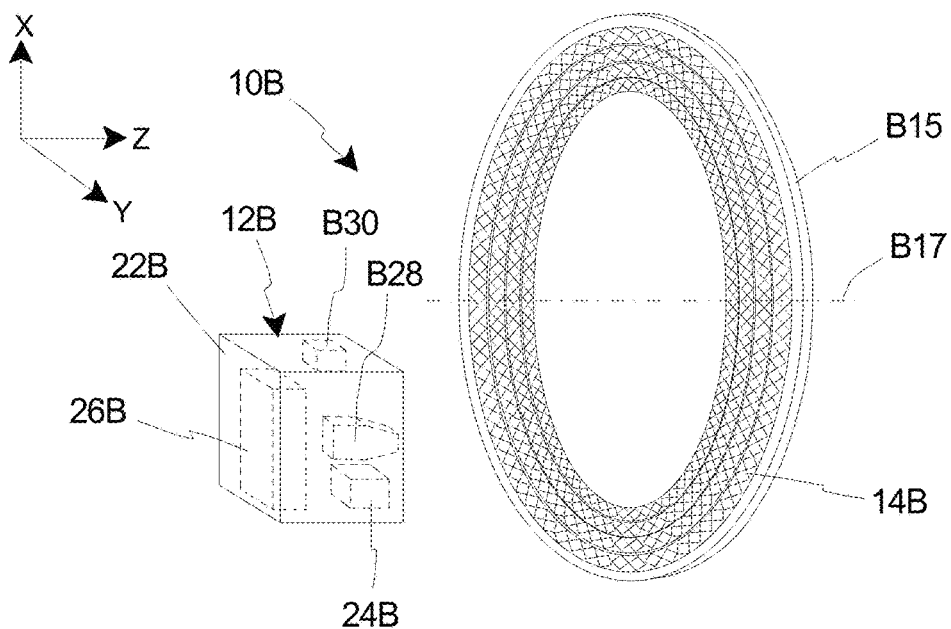
FIG. 1B is a simplified perspective view illustration of another embodiment of the position encoder.

FIG. 1B is a simplified perspective view illustration of another embodiment of the position encoder 10B. More specifically, FIG. 1B illustrates the position encoder 10B having features of the present invention being configured to operate as a rotary encoder. As shown in FIG. 1B, the position encoder 10B includes an image sensor assembly 12B having a sensor head 22B, an illumination system 24B (illustrated in phantom), an image sensor 26B (illustrated in phantom), an optical system B28 (illustrated in phantom), and a control system B30 (illustrated in phantom); and a target pattern 14B.

Additionally, in this embodiment, the target pattern 14B is coupled to a disk B15. Further, as shown, the disk B15 can have a rotational axis B17 about which the disk B15 rotates. The disk B15 and thus the rotational axis B17 can be oriented in any suitable manner. For example, as shown in FIG. 1B, in one embodiment, the disk B15 can be oriented such that the rotational axis B17 is parallel to the axis, e.g., the Z axis, which defines the spacing between the image sensor 26B and the target pattern 14B. In another embodiment (not shown in FIG. 1B), the disk B15 can be oriented such that the rotational axis B17 is perpendicular to the axis, e.g., the Z axis, which defines the spacing between the image sensor 26B and the target pattern 14B. In some such embodiments, the target pattern 14B is preferably placed on a cylindrical circumference of the disk B15 instead of one of its flat surfaces.

In certain embodiments, the image sensor 26B can include an array of detector elements (not shown in FIG. 1B) that are arranged in one of an arc about the rotational axis B17 and in a line tangential to the rotational axis B17. In such embodiments, the control system B30 can determine the rotational position of an object (to which the image sensor 26B is coupled) about the rotational axis B17 relative to the target pattern 14B. In other embodiments, the image sensor 26B can include an array of detector elements that are arranged in one of radially about the rotational axis B17 and perpendicular to a line tangential to the rotational axis B17.

In such embodiments, the control system B30 can determine the radial position (i.e. circular runout) of the object relative to the target pattern 14B. In still other embodiments, the sensor assembly 12B can be configured to measure both the tangential and radial motion of the object (coupled to the image sensor 26B) relative to the target pattern 14B.

Figure 2:
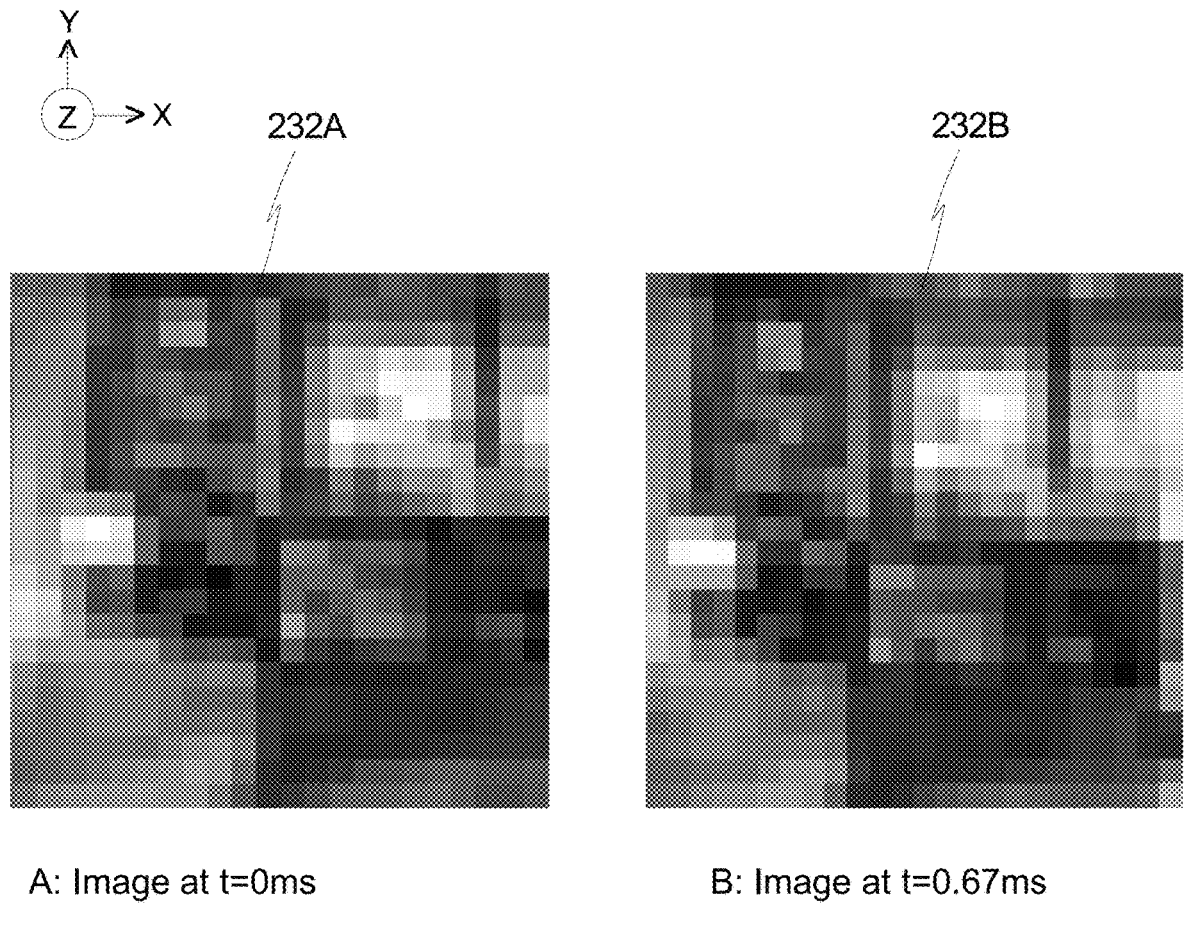
FIG. 2 illustrates a first image and a second image captured with the image sensor assembly illustrated in FIG. 1A.

FIG. 2 illustrates two images 232A, 232B captured by the image sensor assembly 12 (illustrated in FIG. 1A) at two different times. More specifically, FIG. 2 includes a first image 232A captured at time zero milliseconds (t=0 ms), and a second image 232B captured at a time that is 0.67 milliseconds later (t=0.67 ms). During this time interval, relative movement has occurred between the image sensor assembly 12 and the target pattern 14 (illustrated in FIG. 1A), and thus between the first object 15A (illustrated in FIG. 1A) and the second object 15B (illustrated in FIG. 1A). As a result thereof, the second image 232B is similar, but slightly offset from the first image 232A. Thus, the two images 232A, 232B can be analyzed and the relative displacement of the objects 15A, 15B along the X and Y axes can be determined. In particular, the control system 30 (illustrated in FIG. 1A) can process these images 232A, 232B using cross-correlation to calculate how much each successive image is offset from the previous one to determine the relative movement. Stated in another fashion, comparing images 232A and 232B, the amount of relative movement between the image sensor assembly 12 (and thus the first object 15A) and the target pattern 14 (and thus the second object 15B) along the X axis during this time interval is equal to the amount of offset between the images 232A, 232B along the X axis; and the amount of relative movement between the image sensor assembly 12 (and thus the first object 15A) and the target pattern 14 (and thus the second object 15B) along the Y axis during this time interval is equal to the amount of offset between the images 232A, 232B along the Y axis.

As provided herein, in certain embodiments, the target pattern 14 can be relatively large and can have a lot of irregularities that can be captured with the images 232A, 232B and analyzed to determine relative movement. Additionally and/or alternatively, the target pattern 14 can be modified and/or designed to include one or more features, such as noted above, that can be organized in a pattern to speed up the analysis of the images, and increase the accuracy of the image sensor assembly 12. For example, certain features may be encoded into the target pattern 14 that allow the image sensor assembly 12 to periodically "reset" itself when it sees a pattern with a known location, and thus update the absolute location of the image sensor assembly 12.

In certain applications, the present invention also includes one or more additional methods for further improving the tracking speed and accuracy of the two-dimensional image sensor assembly 12. For example, in some such applications, the measurement rate for such a two-dimensional image sensor assembly 12 can be improved by using dead-reckoning information to predict the expected image or otherwise reduce the detection or computational requirements of the image acquisition or processing. For example, when the position encoder 10 is used as part of a stage assembly (such as the stage assembly 816 illustrated in FIG. 8), the control system 30 can control a stage mover assembly 834 (illustrated in FIG. 8) to move the stage 818 (illustrated in FIG. 8) along a desired trajectory for the stage 818. Thus, in such applications, to a very large extent, the control system 30 knows where the stage 818 is going at all times. This means that the control system 30 will have a very good idea of which two sections of the subsequent images will overlap. Additionally, even in situations where the desired trajectory is not known, the control system 30 can utilize previous position measurements, as well as a known previous path and velocity of the image sensor assembly 12 relative to the target pattern 14, to monitor the relative position and movement between the image sensor assembly 12 and the target pattern 14 with improved accuracy.

In summary, in certain embodiments, the position encoder 10 provided herein is a low-cost, high-speed, two-dimensional position encoder. The position encoder 10 as described herein has a very large read head clearance 35 (illustrated in FIG. 1A), i.e. the spacing between the position encoder 10 and the target pattern 14, and can track across large areas. The read head clearance 35 is defined by the depth of focus of the optical system. It is understood that as long as features (e.g., peaks and valleys) are distinguishable in the resulting image, position can be effectively and accurately calculated. Conversely, it is appreciated that the head is considered to be out of range when there is so much defocus blur that no signal can be effectively extracted from the image. As alternative, non-exclusive examples, the position encoder 10 can be designed to operate with a read head clearance 35 of at least 2, 5, 10, or 20 millimeters.

Additionally, as demonstrated in FIG. 2, the position encoder 10 can operate by analyzing the difference between successive image profiles of the target pattern 14 to determine the relative position and movement between the image sensor assembly 12 and the target pattern 14. It is further appreciated, as provided herein, that with certain information being encoded into the target pattern 14, the absolute position of the image sensor assembly 12 can be determined by the position encoder 10 with only a single image of the target pattern 14 being captured.

As noted above, the image sensor 26 (illustrated in FIG. 1A) can be configured to sense information from the illumination beam(s) being directed toward and impinging on the target pattern 14 (illustrated in FIG. 1A). Further, as described in reference to FIGS. 3A-3C, in certain embodiments, the position encoder 10 (illustrated in FIG. 1A) can generate an independent image profile for each of the two planar dimensions based on the data received from the image sensor 26. In certain embodiments, these profiles are created by summing the individual pixel outputs in rows and in columns. By collecting data and performing analysis on these profiles rather than full images, data acquisition and processing time can be dramatically reduced. It is appreciated that in certain embodiments, the position encoder 10 can be configured to generate such an image profile in only one planar dimension, e.g., for a one degree of freedom system.

Moreover, in one embodiment, the initial image profiles, e.g., an initial X axis image profile and an initial Y axis image profile, can be captured and stored as reference image profiles. Each set of successive image profiles can then be compared to the reference image profiles, which eliminates accumulative error. Stated in another manner, by only comparing any new image profiles to the reference image profiles, any error that occurs in any such comparison will not be carried through to a subsequent comparison of new image profiles to the reference image profiles. For example, as described herein, features such as peaks and troughs can be identified in the reference image profiles and new peaks and troughs (or other suitable features) can be tracked or identified in subsequent image profiles that follow, with the number of such features that have passed since the reference image being counted.

Figure 3A:
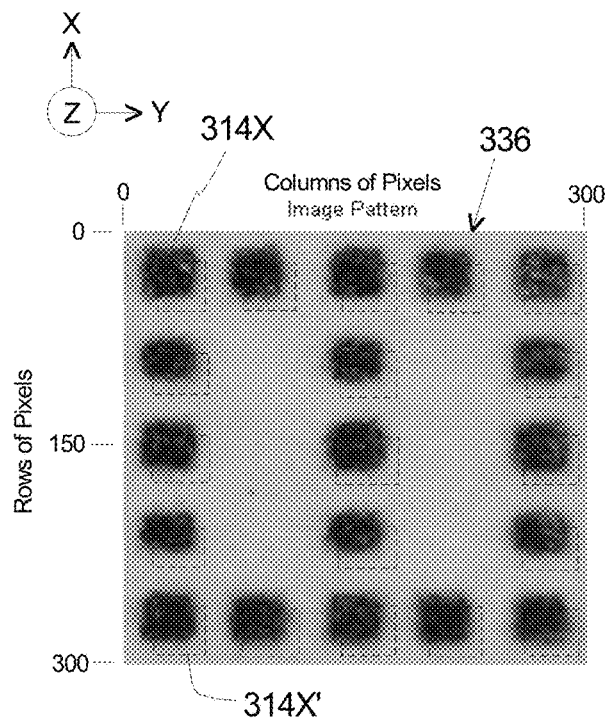
FIG. 3A illustrates an image of an embodiment of the target pattern captured with the image sensor assembly illustrated in FIG. 1A.

FIG. 3A illustrates a non-exclusive example of an image 336 of an embodiment of the target pattern captured with the image sensor assembly 12 illustrated in FIG. 1A. The number of pixels in the image 336 will vary according to the number of pixels and the design of the image sensor 26 (illustrated in FIG. 1A). As shown in FIG. 3A, the image 336 can include three hundred (300) rows of pixels that extend in the Y direction and three hundred (300) columns of pixels that extend in the X direction. Thus, the image 336 includes ninety thousand pixels that are arranged in a 300-by-300 array. Alternatively, the image 336 can include greater than or less than three hundred rows of pixels, greater than or less than three hundred columns of pixels, and/or greater than or less than ninety thousand total pixels that can be arranged in a different manner.

Designing a target pattern that takes advantage of the way the image sensor 26 (illustrated in FIG. 1A) works further enhances the overall performance of the image sensor assembly 12. For example, as illustrated in FIG. 3A, highly contrasting regions within the target pattern provide excellent features for tracking and counting. By keeping track of how many peaks and valleys have crossed an arbitrary constant point on the image sensor 26, errors can be eliminated that may otherwise exist in a more conventional system. In FIG. 3A, the target pattern includes a plurality of darkened squares 314X that are positioned in a particular pattern along a lighter colored background, thereby providing desired high contrast between the elements of the target pattern. Additionally, FIG. 3A further illustrates relative movement of the darkened squares 314X' (illustrated in dashed lines) that may occur and be shown in a subsequent image due to relative movement between the image sensor 26 and the target pattern. In particular, as shown, the darkened squares 314X' representing such potential relative movement are shown as being slightly offset in both the X direction and the Y direction from the position of the darkened squares 314X in the original image 336.

As provided in greater detail herein below, it is appreciated that the particular design of the target pattern can be varied as desired. In certain embodiments, it is beneficial to have sufficiently highly contrasting regions exist within the target pattern to enable easy and effective tracking and counting. For example, in one alternative pattern, the target pattern can be rotated by ninety degrees relative to what is specifically shown in FIG. 3A to provide another suitable pattern for accurate detection. Additionally, it is appreciated that further information can be encoded into the target pattern by changing the relative height of the various peaks and valleys that can be seen from the summing of light intensity found in the rows and columns of the target pattern.

Figure 3B:
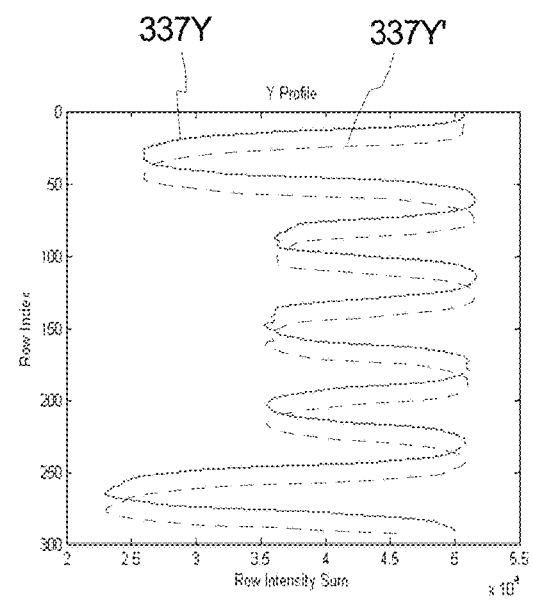
FIG. 3B is a graphical illustration of a measurement of the light intensity summed along a first axis in the image illustrated in FIG. 3A.

FIG. 3B is a graphical illustration, i.e. a first Y curve 337Y (illustrated with a solid line), of a measurement of the light intensity summed along a first axis, e.g., along the Y axis, in the image 336 illustrated in FIG. 3A. More particularly, FIG. 3B illustrates the light intensity sum for each row of pixels, based on the position of the darkened squares 314X in the image 336, that extends from one side of the image 336 to the other side of the image 336 in the Y direction. Additionally, FIG. 3B further graphically illustrates, i.e. with a second Y curve 337Y' (illustrated with a dashed line), a measurement of the light intensity summed along the first axis for each row of pixels, based on the position of the darkened squares 314X', that extends in the Y direction based on the potential relative movement between the image sensor 26 and the target pattern.

As utilized herein, the light intensity sum for one or more of the rows of pixels can be referred to generally as a "light intensity signal". It is appreciated that the light intensity for each row of pixels (as well as for each pixel in the row) has been sensed by the image sensor 26 (illustrated in FIG. 1A), i.e. by the plurality of detector rows of the image sensor 26. Additionally, the summed information for each of the detector rows of the image sensor 26 can also be referred to herein as a "summed row output". Thus, for the plurality of detector rows of the image sensor 26, the summed information can be referred to as a plurality of summed row outputs.

As noted above, the image 336 includes three hundred (300) rows of pixels that extend in the Y direction. For each row of pixels, the light intensity is detected, measured and/or summed in the Y direction, and is thus shown in the graph. As can be seen in FIG. 3B, in rows of pixels that do not include any portion of the darkened squares, the summed intensity of light is at or near a peak value. Conversely, in rows of pixels that do include any such darkened squares, the summed intensity of light is evidenced by the valleys illustrated in FIG. 3B, with the depth of the valley corresponding with the number of darkened squares within the row.

By comparing the first Y curve 337Y and the second Y curve 337Y', i.e. by looking at the movement of the peaks and valleys within the curves 337Y, 337Y', relative movement between the image sensor 26 and the target pattern along the first axis can be effectively determined.

As shown in FIG. 3B, each of the peaks and valleys of the summed intensity of light has a somewhat rounded (i.e. non-squared) profile. This provides evidence that the darkened squares are not precisely consistent in light intensity as captured in the image 336. It is appreciated that it is merely important that the overall target pattern is easily recognizable and distinguishable, i.e. as a specific known target pattern, in order to be able to effectively identify the relative position between the image sensor assembly 12 (illustrated in FIG. 1A) and the target pattern 14 (illustrated in FIG. 1A).

Figure 3C:
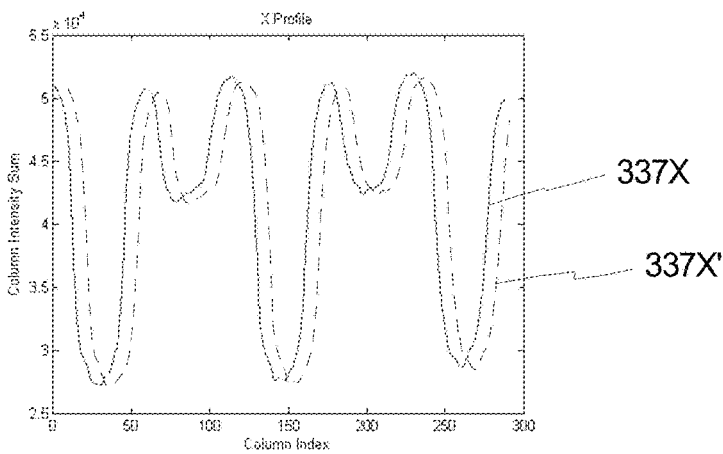
FIG. 3C is a graphical illustration of a measurement of the light intensity summed along a second axis in the image illustrated in FIG. 3A.

FIG. 3C is a graphical illustration, i.e. a first X curve 337X (illustrated with a solid line), of a measurement of the light intensity summed along a second axis, e.g., along the X axis, in the image 336 illustrated in FIG. 3A. More particularly, FIG. 3C illustrates the light intensity sum for each column of pixels, based on the position of the darkened squares 314X in the image 336, that extends from one side of the image 336 to the other side of the image 336 in the X direction. Additionally, FIG. 3C further graphically illustrates, i.e. with a second X curve 337X' (illustrated with a dashed line), a measurement of the light intensity summed along the second axis for each column of pixels, based on the position of the darkened squares 314X', that extends in the Y direction based on the potential relative movement between the image sensor 26 and the target pattern.

As utilized herein, the light intensity sum for one or more of the columns of pixels can be referred to generally as a "light intensity signal". It is appreciated that the light intensity for each column of pixels (as well as for each pixel in the column) has been sensed by the image sensor 26 (illustrated in FIG. 1A), i.e. by the plurality of detector columns of the image sensor 26. Additionally, the summed information for each of the detector columns of the image sensor 26 can also be referred to herein as a "summed column output". Thus, for the plurality of detector columns of the image sensor 26, the summed information can be referred to as a plurality of summed column outputs.

As noted above, the image 336 includes three hundred (300) columns of pixels that extend in the X direction. For each column of pixels, the light intensity is detected, measured and/or summed in the X direction, and is thus shown in the graph. As can be seen in FIG. 3C, in columns of pixels that do not include any portion of the darkened squares, the summed intensity of light is at or near a peak value. Conversely, in columns of pixels that do include any such darkened squares, the summed intensity of light is evidenced by the valleys illustrated in FIG. 3C, with the depth of the valley corresponding with the number of darkened squares within the row. As further shown in FIG. 3C, each of the peaks and valleys of the summed intensity of light has a somewhat rounded (i.e. non-squared) profile for similar reasons as described above.

By comparing the first X curve 337X and the second X curve 337X', i.e. by looking at the movement of the peaks and valleys within the curves 337X, 337X', relative movement between the image sensor 26 and the target pattern along the second axis can be effectively determined.

With a system such as described in FIGS. 3A-3C, as provided herein, processing time can be greatly reduced not only by reducing the number of data points that are required for proper and accurate analysis, but also by decoupling the axes, and allowing the processing algorithms incorporated into the control system 30 (illustrated in FIG. 1A) to individually work in parallel on each of the axes, i.e. individually on each of the X axis and the Y axis. Additionally, the target pattern also eliminates the need for arbitrary image feature recognition in the processing algorithm, as the features of the target pattern are already known.

As provided herein, there are many variations of the basic inventive concept that can be used in various embodiments of the present invention. More particularly, the overall design of the position encoder 10 (illustrated in FIG. 1A) can be varied and modified by utilizing alternative embodiments for the various components included within the position encoder 10. For example, as set forth in greater detail herein below, the position encoder 10 can at least include variations in the illumination system 24 (illustrated in FIG. 1A), the image sensor 26 (illustrated in FIG. 1A), the control system 30 (illustrated in FIG. 1A) and the target pattern 14 (illustrated in FIG. 1A) that provide certain enhancements and/or flexibility to the overall operation of the position encoder 10.

Figure 4:
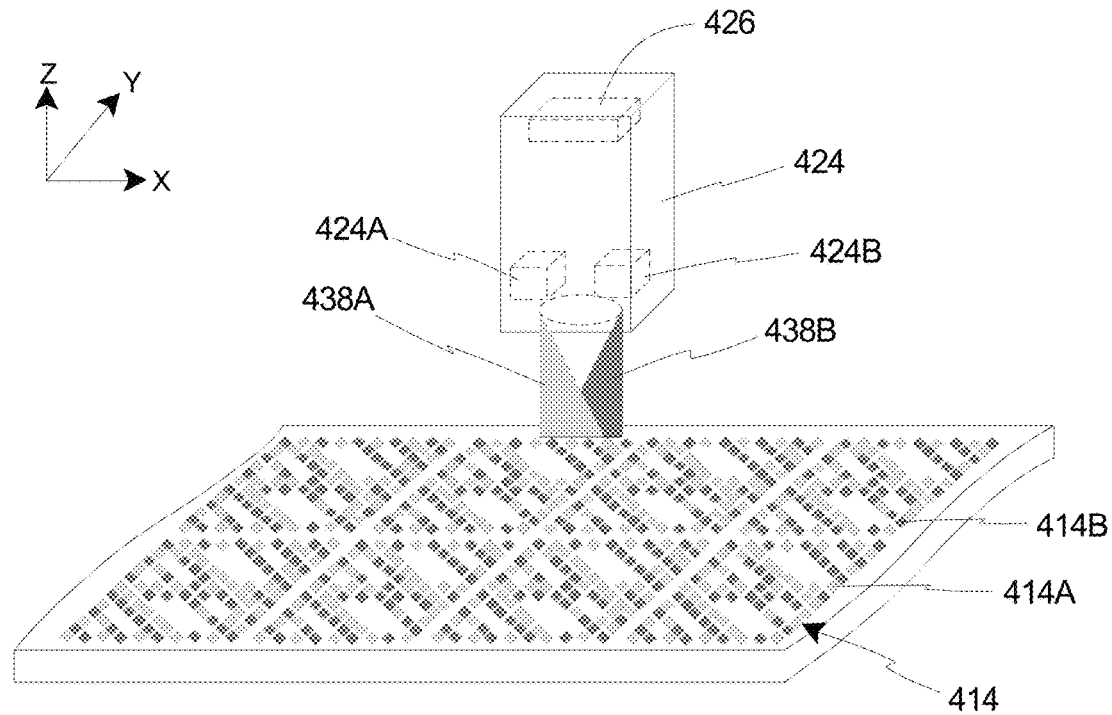
FIG. 4 is a simplified perspective view illustration of an embodiment of an illumination system usable as part of the position encoder, and another embodiment of the target pattern.

FIG. 4 is a simplified perspective view illustration of an embodiment of the illumination system 424 that can be used as part of the position encoder 10 illustrated in FIG. 1A. Additionally, FIG. 4 also illustrates another embodiment of the target pattern 414, i.e. an embodiment of the target pattern 414 that is configured so that it can be effectively utilized in conjunction with this embodiment of the illumination system 424.

In certain embodiments, the target pattern 414 is designed to have a large amount of information that is encoded into the target pattern 414 and therefore sensed by the image sensor 26 (illustrated in FIG. 1A). The inclusion of such additional encoded information within the target pattern 414 helps to improve the robustness of the image sensor 26 to error.

With reference to FIG. 4, as provided herein, the problem of communicating additional information in the position encoder 10 is solved by use of a target pattern 414 comprising different pattern elements, e.g., elements of different colors (two or more different colors), and illuminating the target pattern 414 with the illumination system 424 that directs different, strobed light beams having different beam characteristics, e.g., different beam wavelengths (two or more different wavelength beams) or different beam polarizations, at the target pattern 414. In particular, in the embodiment illustrated in FIG. 4, the illumination system 424 is a two-color strobed illumination system 424, which alternatively strobes a first illumination beam 438A (e.g., a red beam) that is at a first wavelength and a second illumination beam 438B (e.g., a blue beam) that is at a second wavelength that is different than the first wavelength, at the target pattern 414. It is appreciated that the use of multiple colors can include such colors as red and blue, but can also include other suitable/contrastable colors such as black and white, or colors with different alternative grayscale values. For example, in certain embodiments, the illumination system 424 can include a first illumination source 424A (e.g. a red LED) and a second illumination source 424B (e.g. a blue LED) that are controlled to generate the respective illumination beams 438A, 438B. Alternatively, in other embodiments, the illumination system 424 can include a single illumination source that generates a single illumination beam that is subsequently split into multiple illumination beams, e.g., with a beam splitter, before directing the illumination beams toward the target pattern 414. Still alternatively, the strobed illumination system 424 could be designed to strobe more than two different colors at the target pattern 414.

In another embodiment, as noted, the first illumination beam 438A and the second illumination beam 438B can have different polarizations from one another. In particular, in such embodiment, the first illumination beam 438A can have a first polarization and the second illumination beam 438B can have a second polarization that is different than the first polarization. For example, the first illumination beam 438A can have a p-type polarization, with an electrical field that extends along the plane of incidence, and the second illumination beam 438B can have an s-type polarization, with an electrical field that extends perpendicular to the plane of incidence. Alternatively, the first illumination beam 438A can have an s-type polarization, and the second illumination beam 438B can have a p-type polarization.

It is appreciated that the first illumination beam 438A and the second illumination beam 438B can differ in other beam characteristics than wavelength or polarization within the scope of the present invention.

Additionally, the timing of the strobing of the illumination beams 438A, 438B can be varied as desired. For example, the illumination beams 438A, 438B can be strobed such that there is at least some overlap in the timing of the first illumination beam 438A and the second illumination beam 438B being directed toward the target pattern 414. Alternatively, the illumination system 424 can be configured such that the illumination beams 438A, 438B alternate or otherwise are not directed toward the target pattern 414 at the same time. In such embodiments, the image sensor 426 can be configured to sense information to essentially capture a separate image as each illumination beam 438A, 438B is individually directed toward and impinges on the target pattern 414.

Further, as shown in FIG. 4, the illumination beams 438A, 438B can be directed at the target pattern 414 in an at least partially spatially overlapping manner. For example, in one embodiment, the first illumination beam 438A and the second illumination beam 438B can follow a common beam path from the illumination system 424 to the target pattern 414. Alternatively, the illumination beams 438A, 438B can be spaced apart from one another as they are directed at the target pattern 414. It is appreciated that the illumination beams 438A, 438B are shown in FIG. 4 as partially overlapping one another for purposes of discussion and ease of illustration, and no limitations are intended by such illustration.

Additionally, in one embodiment, the target pattern 414 includes a plurality of first pattern elements 414A (illustrated in a light gray pattern) that are visible to the image sensor 26 when illuminated with the first illumination beam 438A (e.g., that is at the first wavelength and/or the first polarization), and a plurality of second pattern elements 414B (illustrated in a darker gray pattern) that are visible to the image sensor 26 when illuminated with the second illumination beam 438B (e.g., that is at the second wavelength and/or the second polarization). Stated in another manner, in such embodiment, the plurality of first pattern elements 414A are reflective to the first illumination beam 438A and the plurality of second pattern elements 414B are reflective to the second illumination beam 438B. Additionally, in such embodiment, the plurality of first pattern elements 414A can be configured such that they are not reflective to the second illumination beam 438B, and the plurality of second pattern elements 414B can be configured such that they are not reflective to the first illumination beam 438B.

As shown in this embodiment, the plurality of first pattern elements 414A and the plurality of second pattern elements 414B are integrated together to form the target pattern 414. Alternatively, the first pattern elements 414A and the second pattern elements 414B need not be integrated together, i.e. the first pattern elements 414A and the second pattern elements 414B can be spaced apart from one another with no overlap between them.

Further, in some embodiments, each of the plurality of first pattern elements 414A and the plurality of second pattern elements 414B can individually be formed into repetitive patterns that are combined together to form the target pattern 414. Additionally and/or alternatively, one or both of the plurality of first pattern elements 414A and the plurality of second pattern elements 414B can include non-repetitive pattern elements.

It is appreciated that the reference herein to a plurality of first pattern elements and a plurality of second pattern elements is merely for convenience and ease of illustration, and either plurality of pattern elements can be referred to as the "plurality of first pattern elements" and/or the "plurality of second pattern elements".

This modification of the illumination system 424 of the position encoder 10 as illustrated in FIG. 4 adds the capability to encode additional information into the target pattern 414 that is used to further sense the X-Y (or other) motion. Additionally, this modification to the illumination system 424 can provide the option of using a sub-optimal target pattern 414, indeed even one that could not be used at all to detect the position change of the target pattern 414, to gain additional information. For example, one advantage is that with the second pattern elements 414B, additional information can be hidden and extracted while the first pattern elements 414A are used to provide the accuracy and robustness for the position encoder 10. More specifically, in certain applications, the second pattern elements 414B could be used to encode an absolute position of the target pattern 414. It is further appreciated that the pattern created with the second pattern elements 414B could also be larger or smaller than the pattern created with the first pattern elements 414A, thus enabling the image sensor 26 and the position encoder 10 as a whole to work at different speeds or resolutions.

As provided herein, the present invention is a position encoder 10 (illustrated in FIG. 1A) that is based on an optical imaging system that utilizes an image sensor (e.g., the image sensor 26 illustrated in FIG. 1A) to observe the target pattern (e.g., the target pattern 14 illustrated in FIG. 1A). Additionally, as noted above, the design of the image sensor 26 that is included as part of the position encoder 10 can also be varied to suit the specific requirements and intended uses of the position encoder 10. In certain embodiments, the problem of building a position encoder 10 using an imaging optical system is solved by using a multi-pixel optoelectronic image sensor (or detector).

Figures 5A, 5B:
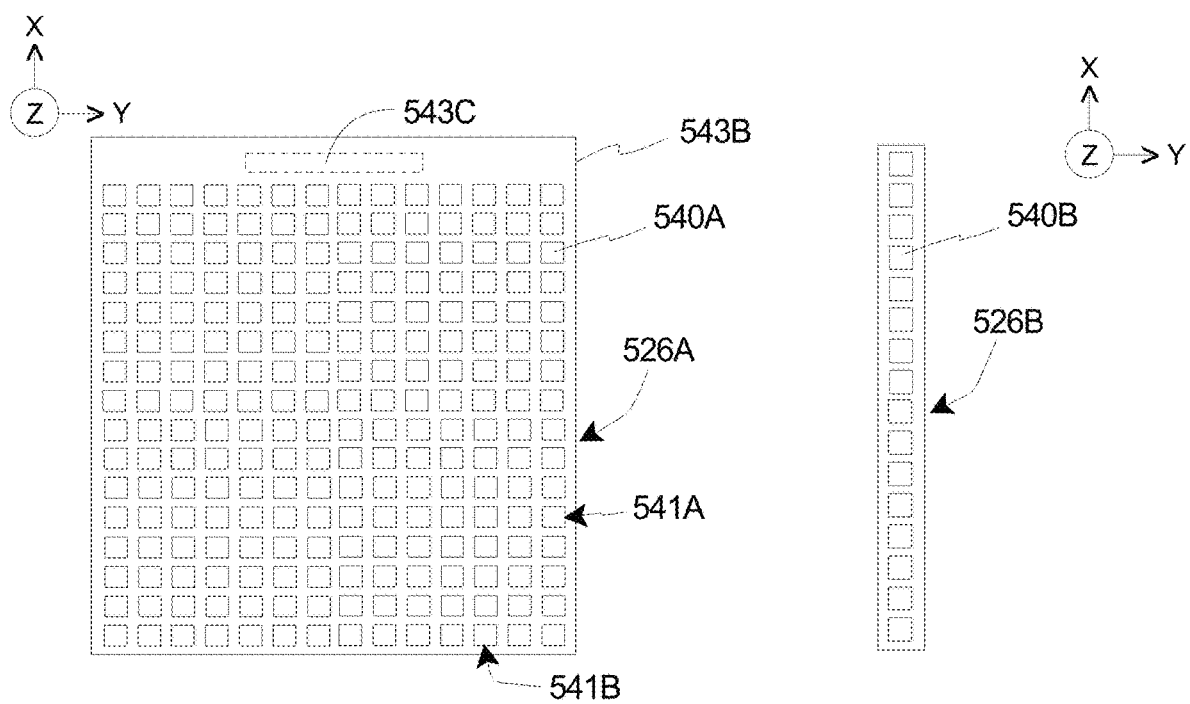
FIG. 5A is a simplified schematic illustration of an embodiment of an image sensor usable as part of the position encoder.
FIG. 5B is a simplified schematic illustration of another embodiment of the image sensor.

FIG. 5A is a simplified schematic illustration of an embodiment of an image sensor 526A usable as part of the position encoder 10. To take advantage of the capabilities of the optical imaging system, in some embodiments, the image sensor 526A includes a plurality of individual pixel detector elements 540A (also sometimes referred to herein simply as "detector elements"). Additionally, as illustrated, the detector elements 540A of the image sensor 526A can be arranged in a two-dimensional array including a plurality of detector rows 541A and a plurality of detector columns 541B. More specifically, in one such embodiment, the image sensor 526A can be oriented such that the array of detector elements 540A is oriented along a pair of axes, e.g., the X axis and the Y axis, that are perpendicular to the axis, e.g., the Z axis, along which the image sensor 526A is spaced apart from the target pattern 14 (illustrated in FIG. 1A). Alternatively, the detector elements 540A of the image sensor 526A can be arranged in a one-dimensional array.

There are several types of image sensor that can be used, depending on the cost and performance requirements of a given application. Additionally, the number of detector elements 540A and the arrangement of the detector elements 540A can be varied to suit the desired measurement requirements.

For example, as illustrated in FIG. 5A, in certain embodiments, the image sensor 526A can be a two-dimensional "linear profile" type sensor. An example of such an image sensor 526A is the S9132 profile sensor from Hamamatsu Photonics K. K. of Hamamatsu City, Japan (see e.g., https://www.hamamatsu.com/us/en/product/alpha/P/4213/S9132/index.html). As shown, the image sensor 526A includes a two-dimensional array of detector elements 540A (or pixels) wherein the data from each detector row 541A and each detector column 541B is electrically summed together within the image sensor 526A itself, e.g., within a controller 543C (illustrated in phantom) that is contained within a body 543B of the image sensor 526A. In certain embodiments, the electrical summing of the data or information for each detector row 541A and each detector column 541B are accomplished in a manner substantially similar to what was described in detail above in relation to FIGS. 3A-3C. Accordingly, a detailed description of the electrical summing process will not be repeated herein. As a result of the electrical summing process that is performed within the image sensor 526A, for an N×N array of detector elements 540A, only 2N data are output instead of N^2. For many encoder applications, this type of image sensor 526A is preferable because it reduces the amount of data and thereby simplifies the position detecting electronics and algorithms. More specifically, in such embodiments, the output from the image sensor 526A is simply in the form of a plurality of summed row outputs and a plurality of summed column outputs.

It is appreciated that FIG. 5A merely shows a small number or array of detector elements 540A (or pixels) within the image sensor 526A for purposes of simplicity and ease of illustration. It is further appreciated that a typical such two-dimensional image sensor 526A could contain a much larger number or array of detector elements 540A than what is specifically shown in FIG. 5A, and no limitation is intended by what is specifically illustrated in FIG. 5A.

Another suitable image sensor is a two-dimensional image sensor that acquires a full two-dimensional picture of the target surface (target pattern) or encoder scale. These image sensors are commonly used in digital cameras and are typically based on CCD or CMOS devices. The basic layout of such an image sensor is substantially similar to what is illustrated in FIG. 5A. However, in this embodiment, the image sensor is configured to output the full two-dimensional image of the target pattern, and not an image profile with a plurality of summed row outputs and a plurality of summed column outputs. It is appreciated that with the use of such an image sensor, the electrical summing of the light intensity for each row and each column of detector elements can be performed within the control system 30 (illustrated in FIG. 1A) instead of within the image sensor itself.

FIG. 5B is a simplified schematic illustration of another embodiment of the image sensor 526B. As illustrated, this embodiment of the image sensor 526B is a linear, one-dimensional CCD or CMOS type of image sensor that includes a one-dimensional array of detector elements 540B (or pixels). For example, the image sensor 526B can include a single column of detector elements 540B and a plurality of rows of detector elements 540B, or a plurality of columns of detector elements 540B and a single row of detector elements 540B. In such embodiments, the image sensor 526B can be easily rotated as necessary and desired for usage such that the reference to column(s) of detector elements 540B and row(s) of detector elements 540B are effectively interchangeable. An example of such an image sensor is the S11490 from Hamamatsu Photonics K. K. (see e.g., https://www.hamamatsu.com/us/en/S11490.html). This type of image sensor 526B also produces a compact data stream and may be suitable for use in the position encoder 10 (illustrated in FIG. 1A). Depending on the application, one linear image sensor can be used for a one-dimensional sensor, or two orthogonal image sensors can be used to create a two-dimensional sensor, i.e. the system can incorporate a first image sensor having a first one-dimensional array of detector elements that extend in a first direction (e.g., along the X axis); and a second image sensor having a second one-dimensional array of detector elements that extend in a second direction (e.g., along the Y axis) that is orthogonal to the first direction.

It is appreciated that FIG. 5B merely shows a small number or array of detector elements 540B (or pixels) within the image sensor 526B for purposes of simplicity and ease of illustration. More specifically, in one embodiment, the image sensor 526B can be oriented such that the array of detector elements 540B is oriented along an axis, e.g., either the X axis or the Y axis, that is perpendicular to the axis, e.g., the Z axis, along which the image sensor 526B is spaced apart from the target pattern 14 (illustrated in FIG. 1A). It is further appreciated that a typical such one-dimensional image sensor 526B could contain a much larger number or array of detector elements than what is specifically shown in FIG. 5B, and no limitation is intended by what is specifically illustrated in FIG. 5B.

Thus, the various embodiments of the position encoder illustrated and described herein use an optical imaging system in conjunction with a linear or two-dimensional multi-pixel image sensor (or detector).

Because all of these image sensor 526A, 526B types collect information from the illumination beam(s) (e.g., one or both of the illumination beams 438A, 438B illustrated in FIG. 4) impinging on the target pattern (e.g., the target pattern 14 illustrated in FIG. 1A), the output data from the image sensor 526A, 526B can be processed by a variety of algorithms. Additionally, some of the algorithms incorporated into the position encoder may allow measurement of position in a direction perpendicular to the surface upon which the target pattern 14 is coupled or formed. For example, when the position encoder is being used as a three-dimensional linear encoder, the algorithms designed within the control system 30 (illustrated in FIG. 1A) can be configured to monitor position or motion in a direction perpendicular to the target pattern surface, e.g., vertical motion along the Z axis. In one such embodiment, the algorithm can detect such position or motion by detecting changes in the focus of the target pattern 14 that is sensed by the image sensor 526A, 526B. More particularly, when focusing light from the target pattern 14 onto the image sensor 526A, 526B, one or more of the lenses 28A of the optical system 28 may need to be moved, e.g., with the optical mover assembly 28B, to provide proper or sharp focus of the light onto the image sensor 526A, 526B. The algorithm can be configured to analyze the movement of the lenses 28A to properly determine movement or position in the vertical direction (along the Z axis). Alternatively, the algorithm can be configured to detect any changes in pitch of the target pattern 14 as light from the target pattern 14 is focused onto the image sensor 526A, 526B. In particular, any changes of the pitch of the target pattern 14, i.e. the distance between pattern elements, found in the information captured by the image sensor 526A, 526B can be analyzed by the determine movement or position in the vertical direction (along the Z axis).

It is appreciated that different means can be utilized within the control system 30 (illustrated in FIG. 1A) of the position encoder 10 in order to effectively communicate with the image sensor, as well as to perform data acquisition and processing. For example, in certain embodiments, the position encoder 10 provided herein uses Field-programmable gate arrays ("FPGA") within the control system 30 to communicate to the image sensor, process the data and then communicate processed data to the computer logging position. However, in such embodiments, a problem may arise where there are many unused peripherals, thereby making it largely overkill. Additionally, because of its large physical size, the FPGA cannot typically be integrated into the sensor head 22 (illustrated in FIG. 1A) of the position encoder 10 itself, which thus adds another bulky block to the overall system. Accordingly, it can be desired to utilize another suitable means for purposes of communicating with the image sensor, and performing data acquisition and processing.

More specifically, in other embodiments, the position encoder 10 uses application-specific integrated circuit ("ASIC") technology, e.g., as formed into the circuit board 30B illustrated in FIG. 1A, to streamline the performance and packaging of the two-dimensional imaging sensor. An ASIC is customized for a particular use, rather than intended for general-purpose use. As such, the ASIC can have a smaller overall footprint than the FPGA. Stated in another manner, in such embodiments, the problem of extra packaging bulk and expense in the position encoder 10 that exists with the use of FPGA is solved by using an ASIC to perform data acquisition and processing. Using ASIC in place of FPGA provides certain advantages for the control system 30, and for the position encoder 10 as a whole. For example, if the data acquisition and image processing algorithms were built into an ASIC, this chip would perform only the desired functions for the position encoder 10 and would also typically be small enough to integrate into the overall packaging of the system, i.e. within the sensor head 22. This, in turn, would reduce the size and cost of each implementation of the position encoder 10. For example, in one embodiment, the ASIC is a chip that can be designed to analyze any and all data and information that is sensed or captured by the image sensor for purposes of detecting position and motion of an object. More particularly, the ASIC can be configured to interpret all such data and information based on the various modifications that may be made within the illumination system, the image sensor and the target pattern.

Additionally, the position encoder 10 typically utilizes a firmware algorithm in order to determine the sensor position based on the measured image data. Thus, in certain embodiments, the present invention is directed to one or more data processing algorithms that are incorporated within the control system 30 of the position encoder 10. More particularly, as provided herein, the position encoder 10 can be configured to use a data processing algorithm that uses known information about the target pattern 14 to detect position with sub-pixel resolution. Several possible embodiments of the data processing algorithm that are designed to provide sub-pixel resolution are provided herein. More particularly, in certain embodiments, the algorithms provided herein can be specifically configured to determine the phase of this signal with sub-pixel resolution.

In some of the target patterns 14 provided herein, the target pattern 14 includes a plurality of lines, dots, squares, diamonds or other shapes that create a periodic pattern on the image structure. Additionally, in many applications of the present invention, the output of the image sensor 26 will approximate a sine wave or square wave. For example, referring briefly back to FIGS. 3A-3C, the image profiles that are generated by the image sensor 26 and/or the control system 30 based on the information sensed by the image sensor 26 can approximate a sine wave or square wave. As described above, each of the peaks and valleys of the summed intensity of light found in the first X curve 337X, the second X curve 337X', the first Y curve 337Y and the second Y curve 337Y' can demonstrate certain imperfections or irregularities within the curve profile. As noted, this provides evidence that the symbols used within the target pattern are not precisely consistent in light intensity as captured in the image 336.

In some embodiments, the position encoder 10 can simply use a peak-finding algorithm to estimate the position. Unfortunately, such embodiments have not always performed in a satisfactory manner when certain imperfections may exist within the image profile.

Accordingly, in accordance with the teachings of the present invention, in certain embodiments, the data processing algorithm can be configured to determine position by analyzing the phase of the detected signal using as much of the available data as possible. For example, in one such embodiment, the phase of the detected signal can be determined using a Fourier Transform or FFT calculation. The FFT calculation algorithm can be specifically configured to address and compensate for any minor irregularities that may exist in the curves that represent the image profiles. Additionally, the FFT calculation algorithm can be built into the electronic hardware or firmware of the control system 30 of the position encoder 10, thereby allowing fast and efficient computation.

In another such embodiment, another method to measure the phase of the detected signal is by fitting a sine wave or parabola to the detector signal. As noted, the various curves 337X, 337X', 337Y, 337Y' illustrated in FIGS. 3B and 3C are generally sine wave or square wave shaped having portions that are shaped similar to a parabola, but further including certain variations that are evidence of imprecision in the consistency in light intensity as captured in the image 336. Accordingly, in such embodiment, the control system 30 can incorporate an algorithm that is specifically designed to fit a sine wave or parabola to the detector signal. More specifically, the specially-designed algorithm can analyze the curves of the image profile and then generate essentially a smoothed version of the curves that compensates for any irregularities or imprecision in the sensed light intensity. These new curves with thus take on the general shape of a sine wave and/or have individual portions that are shaped like a parabola. With such smoothed (or corrected) curves, the position encoder is better able to correctly determine and monitor position of the object(s).

Additionally, as noted above, the control system 30 can further incorporate an algorithm to determine vertical motion and/or rotational alignment of the image sensor 26 and the target pattern 14.

Moreover, in certain embodiments, because the position encoder 10 may be coupled to physical objects, it can be possible and/or desired to set reasonable bounds on the acceleration and velocity between samples. In particular, based on variations that exist in the algorithms used within the control system 30 and the unique encoding of the target pattern, it is appreciated that rapid relative movement between the image sensor and the target pattern can become too great to provide accurate positional analysis of the objects. For example, in embodiments that utilize a repeating pattern, very rapid relative movement can result in successive images capturing different portions of different repetitions of the pattern, e.g., the first image captures a portion of pattern A1 and the second image captures a portion of pattern A2. Since pattern A1 and A2 are identical in this repetitive pattern example, the system may not recognize that movement has occurred from pattern A1 to pattern A2. Thus, the system can be modified to set reasonable bounds on the acceleration and velocity between samples. Such information can then be used to correct for detector errors or measurement glitches that may be evident within the image profiles.

Thus, as provided herein, by providing sub-pixel resolution within the data processing algorithms incorporated within the control system 30, the present invention can help to improve the overall performance of the position encoder 10.

As noted above, in addition to variations that may be made to the illumination system 24 (illustrated in FIG. 1A), the image sensor 26 (illustrated in FIG. 1A) and the control system 30 (illustrated in FIG. 1A), the performance of the position encoder 10 (illustrated in FIG. 1A) may also be enhanced through additional information being encoded into the target pattern, e.g., the target pattern 14 illustrated in FIG. 1A. FIGS. 6A-6F demonstrate alternative embodiments of portions of the target pattern where additional information has been encoded using such alternative methodologies.

Figure 6A:
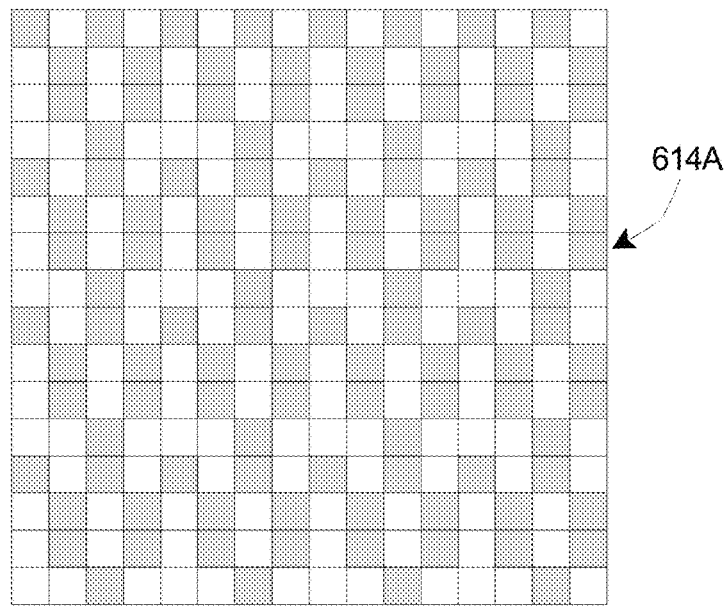
FIG. 6A is a simplified schematic illustration of a portion of another embodiment of the target pattern.

For example, as provided above, in various embodiments, the target pattern 14 utilized as part of the position encoder 10 can include incremental or periodic patterns that are incorporated into the target pattern 14. FIG. 6A is a simplified schematic illustration of a portion of another embodiment of the target pattern 614A. In particular, as illustrated in FIG. 6A, the target pattern 614A includes an incremental or periodic or repeating pattern that is incorporated into the target pattern 614A. Additionally, it is appreciated that a periodic or repeating pattern is also incorporated into the target pattern 14 illustrated in FIG. 1A.

In particular, in such embodiments, the problem of building a position encoder 10 using an imaging optical system is solved by using a target pattern 614A that provides a periodic pattern that is easily viewed by the image sensor 26 (illustrated in FIG. 1A). By utilizing such periodic patterns within the target pattern 614A, the image data can be used to measure the relative phase position of the sensor head 22 (illustrated in FIG. 1A) and the target pattern 614A. For example, in the simplified example shown in FIG. 6A, each four-by-four block of squares (i.e. sixteen total squares in a four-by-four array) of the target pattern 614A has a pattern (i.e. each square is either gray or white) that is the same as each adjacent four-by-four block of squares.

Further, in certain embodiments, it can also be preferable that the target pattern 614A have high image contrast. For example, in many applications, a pattern of black and white lines, squares, diamonds, or circular dots may be used within the target pattern 614A to provide the desired high image contrast. Alternatively, in other embodiments, the target pattern 614A may comprise grayscale features, such as is shown specifically in FIG. 6A. For example, using a one-dimensional or two-dimensional sinusoidal grayscale pattern within the target pattern 614A can provide a clearer sinusoidal signal which may improve the accuracy or simplicity of phase detection algorithms.

As utilized herein, in some non-exclusive alternative embodiments, the target pattern 614A can be said to have high image contrast if the contrast between different pattern elements is at least approximately fifty percent (50%), sixty percent (60%), seventy percent (70%), eighty percent (80%), ninety percent (90%), or one hundred percent (100%). Alternatively, the definition of high image contrast can be somewhat different than the percentages specifically listed herein.

Moreover, using the information provided herein, it is possible to build a high-accuracy, low-cost position encoder 10 including incremental or periodic patterns within the target pattern 614A that provides good tolerance of local defects or particles that may otherwise impact a proper imaging of the target pattern 614A. More specifically, due to the known periodic nature of the target pattern 614A, any small variations in the information received by the image sensor 26, e.g., due to local defects in particles on the target pattern 614A, can be easily dismissed by the control system 30 during analysis of the data from the image sensor 26.

Figure 6B:
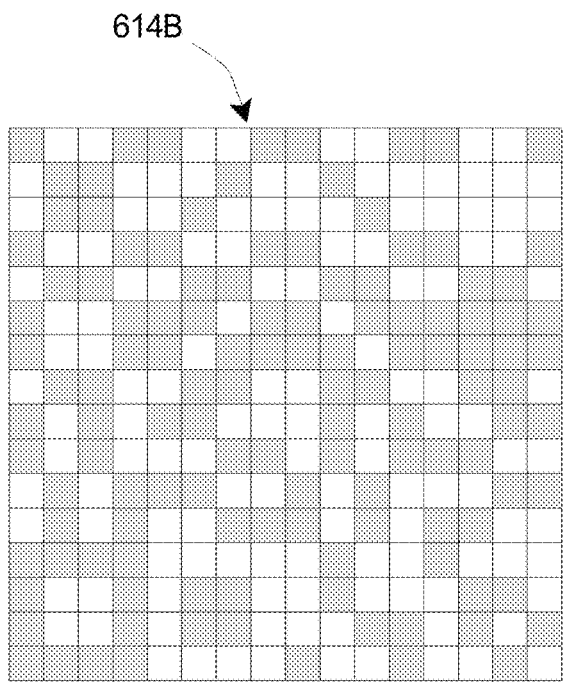
FIG. 6B is a simplified schematic illustration of a portion of still another embodiment of the target pattern.

Additionally, or in the alternative, in other embodiments, the target pattern can be encoded with additional, non-repetitive information that is read by the image sensor 26. FIG. 6B is a simplified schematic illustration of a portion of still another embodiment of the target pattern 614B. In particular, as illustrated in FIG. 6B, the target pattern 614B includes a non-repeating pattern (or non-repeating pattern elements) within the target pattern 614B, which allows the image sensor 26 (illustrated in FIG. 1A) to determine its absolute position, and not just the motion from an arbitrary initialization position. Stated in another manner, in such embodiments, the problem of building an absolute position encoder based on an imaging optical system is solved by encoding a non-repeating pattern into the target pattern 614B that is read by the image sensor 26. For example, in the simplified example shown in FIG. 6B, each four-by-four block of squares (i.e. sixteen total squares in a four-by-four array) of the target pattern 614B has a pattern (i.e. each square is either gray or white) that is different than each adjacent four-by-four block of squares.

Accordingly, as provided herein, by encoding non-repeating (or infrequently repeating) position data into the target pattern 614B, the present invention is able to provide an absolute encoder with a relatively large range of motion.

It is appreciated that in certain embodiments, for a two-dimensional position encoder to cover a large area with high-resolution, a relatively large number of positions may need to be encoded within the target pattern. The present invention provides several embodiments to help overcome this challenge. For example, in one such embodiment, the position encoder 10 can be configured to take advantage of the ability of the image sensor 26 to measure a grayscale value at each pixel. Based on such capabilities, it is possible for the position encoder 10 to have more than a simple on/off binary bit for each pattern dot within the target pattern. For example, the target pattern can incorporate both black and gray dots (or differing shades of gray dots) on a white background, which would enable the accurate detection of position using base-3 instead of binary numbers. Moreover, depending on the specific requirements, higher numerical bases with more grayscale values could also be used. Referring briefly back to FIG. 1A, the target pattern 14 shown includes symbols, e.g., diamonds, including three different grayscale values that can be used to achieve such higher numerical bases.

Figure 6C:
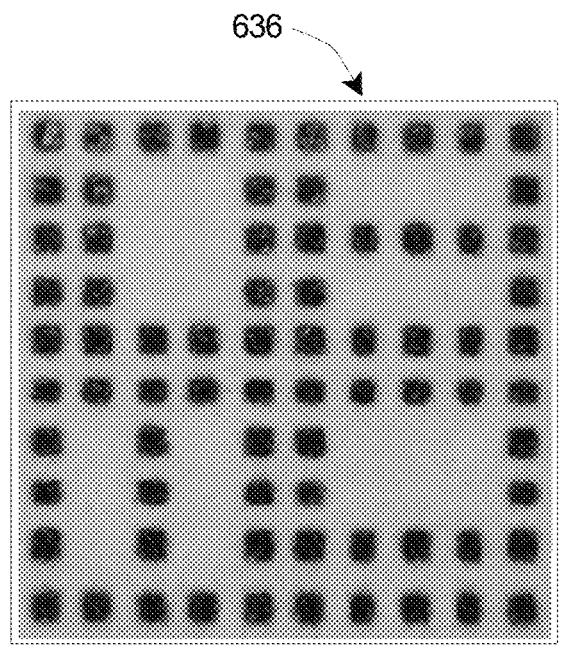
FIG. 6C is a simplified schematic illustration of a portion of yet another embodiment of the target pattern.

In another example, fixed start and/or stop bits can be encoded within the target pattern to delineate the position marks in order to improve error correction. FIG. 6C illustrates a non-exclusive example of an image 636 of a portion of another embodiment of the target pattern captured with the image sensor assembly 12 illustrated in FIG. 1A. In particular, as shown in FIG. 6C, the target pattern includes the use of such fixed start and/or stop bits, which can help to limit the overall greater number of position codes that may otherwise be required. It is understood that the use of such fixed start and/or stop bits can be incorporated into any embodiment of the target pattern illustrated and described herein. For example, such fixed start and/or stop bits can be incorporated into and/or used with either of the target patterns 614A, 614B illustrated and described in relation to FIGS. 6A and 6B, respectively.

As described herein, such fixed start and/or stop bits can function as non-repeating pattern elements that can be utilized to determine absolute position, e.g., of the image sensor 26 (illustrated in FIG. 1A). Unfortunately, in certain applications, sufficient portions of the start and/or stop bits may not be clearly visible to the image sensor 26 at all times. Stated in another manner, it is appreciated that in some applications, there may only be a few bits of the absolute position code visible in the field of view of the image sensor 26 at any one time. In such applications, it is possible that not enough start and/or stop bits may be visible at any given time to provide a fully accurate absolute position. In these cases, it may be necessary to impart a small motion on the image sensor 26 relative to the target pattern 614C in order to be able to sufficiently visualize the start and/or stop bits as part of establishing the absolute position.

As provided above, the present invention envisions even further potential methods that are designed to encode additional information into the target pattern in addition to the use of repeating or non-repeating patterns. For example, FIGS. 6D-6F demonstrate alternative embodiments of the target pattern where additional information has been encoded using such alternative methodologies. In particular, as demonstrated in FIGS. 6D-6F, the problem of a simple two-dimensional target pattern only being capable of providing limited positional information is solved by encoding additional information into the target pattern through the use of pattern elements of multiple colors or that are reflective to multiple colors or polarizations of the illumination beams, overlaying Vernier patterns, and line pattern wobble.

FIG. 6D is a simplified schematic illustration of a portion of another embodiment of the target pattern 614D. In particular, FIG. 6D illustrates that the target pattern 614A can be encoded with additional information by using multiple colors within the target pattern 614D. In such embodiment, the multiple colors utilized within the target pattern 614D can be reflective to different colors and wavelengths of the illumination beams that are being directed toward the target pattern 614D. Additionally, the target pattern 614D can incorporate different pattern elements that are reflective to different polarizations from the illumination system 24 (illustrated in FIG. 1A). An example of multiple such illumination beams, e.g., illumination beams 438A, 438B, being directed toward the target pattern is illustrated and described above in relation to FIG. 4.

By utilizing two different colors within the target pattern 614D (or pattern elements that are reflective to different polarizations), two different patterns, e.g., a first pattern 642D having a first color (or reflective to a first polarization) and a second pattern 644D having a second color (or reflective to a second polarization) that is different than the first color (or first polarization), can be superimposed on one another and read independently using specialized hardware. More particularly, as provided herein, an algorithm can be incorporated within the control system 30 (illustrated in FIG. 1A) that effectively recognizes and distinguishes between the different patterns 642D, 644D as they are illuminated with the different illumination beams 438A, 438B. By way of example, in one embodiment, a coarse pattern and a fine pattern can be superimposed on one another. In such embodiment, the coarse pattern can be utilized to recognize larger relative movements between the image sensor 426 (illustrated in FIG. 4) and the target pattern 614D, and the fine pattern can then be utilized to more precisely identify the relative movements between the image sensor 426 and the target pattern 614D.

As shown in the embodiment illustrated in FIG. 6D, the target pattern 614D includes the first pattern 642D, which can be a pattern of small dots of a first color (e.g., a light gray color as shown in FIG. 6D), and the second pattern 644D, which can be a pattern of large dots of a second color (e.g., a dark gray color as shown in FIG. 6D). With such design for the target pattern 614D, overlap between the first pattern 642D and the second pattern 644D can be designed such that it does not repeat over a certain area (e.g., the overlap between the first pattern 642D and the second pattern 644D can be offset by a different amount along the target pattern 614D within the certain area), thereby allowing absolute position to be encoded within the target pattern 614D.

FIG. 6E is a simplified schematic illustration of a portion of still another embodiment of the target pattern 614E. In particular, FIG. 6E illustrates that the target pattern 614E can be encoded with additional information by using Vernier patterns to extract a beat frequency. As shown in this embodiment, the target pattern 614E can include a first (Vernier) pattern 642E and a partially overlapping second (Vernier) pattern 644E having different periods from one another. More particularly, the first pattern 642E can include a plurality of spaced apart first parallel lines, and the second pattern 644E can include a plurality of spaced apart second parallel lines that at least partially overlap the first parallel lines. Additionally, as shown, the first parallel lines of the first pattern 642E can be spaced apart from one another by a first spacing, and the second parallel lines of the second pattern 644E can be spaced apart from one another by a second spacing that is different than the first spacing.

Additionally, it is understood that the first pattern 642E and the second pattern 644E are illustrated as being vertically offset from one another to more clearly demonstrate the overlap between the two patterns 642E, 644E. Further, in the embodiment shown in FIG. 6E, the first pattern 642E can be a first color (e.g., a light gray color as shown in FIG. 6E), and the second pattern 644E can be a second color (e.g., a dark gray color as shown in FIG. 6E) that is different than the first color. As with the previous embodiment, the overlap between the first pattern 642E and the second pattern 644E can be designed such that it does not repeat over a certain area to allow the absolute position to be encoded within the target pattern 614E.

FIG. 6F is a simplified schematic illustration of a representative portion of still yet another embodiment of the target pattern 614F. In particular, FIG. 6F illustrates that the target pattern 614F can be encoded with additional information by using line pattern wobble or curvature. More specifically, FIG. 6F illustrates that the target pattern 614F can include a first pattern 642F (shown by the two lines to the left in FIG. 6F) and a second pattern 644F (shown by the two lines to the right in FIG. 6F). As shown, the first pattern 642F includes a plurality of spaced apart first curved lines, and the second pattern 644F includes a plurality of spaced apart second curved lines. Additionally, in certain embodiments, the first curved lines of the first pattern 642F have a first curve frequency, and the second curved lines of the second pattern 644F have a second curve frequency that is different than the first curve frequency.

It is appreciated that by adding a small wobble ("curve") to the "lines" (or rows/columns of dots, squares or other shapes) within the target pattern 614F would also allow for extraction of additional information. For example, variation in the curve (wobble) frequency or phase from line to line would allow for non-repeatability over a certain area, and thus enable absolute position encoding. It is appreciated that FIG. 6F illustrates one, non-exclusive example of alternative wobbled patterns 642F, 644F that could be utilized for purposes of encoding additional information into the target pattern 614F.

Additionally, in certain embodiments, the target pattern can be a tile-based target pattern that includes multiple individual patterns. Additionally, in some such embodiments, the individual tiles for the target pattern may be spaced apart from one another. In one such embodiment, the position encoder 10 (illustrated in FIG. 1A) can include a single image sensor 26 (illustrated in FIG. 1A) for purposes of capturing successive images of the tile-based target pattern. In such embodiment, the tile-based target pattern can be secured to or formed into a surface of an object, e.g., the second object 15B illustrated in FIG. 1A, to be monitored. By capturing successive images that include all or portions of one or more tiles of the tile-based target pattern, which can be arranged in a specific known manner along the surface of the object 15B, the image sensor can effectively identify the absolute position of the target pattern. This can be accomplished as the image sensor is able to identify a "home position" by effectively distinguishing between the patterns on each tile. Additionally, this design also minimizes the amount of overlap that is needed between successive images for proper functionality, thereby further enabling an increased tracking speed.

In yet another embodiment, the present invention is directed to multiple image sensor configurations for the position encoder utilizing a tile-based target pattern. FIG.

Figure 7A:
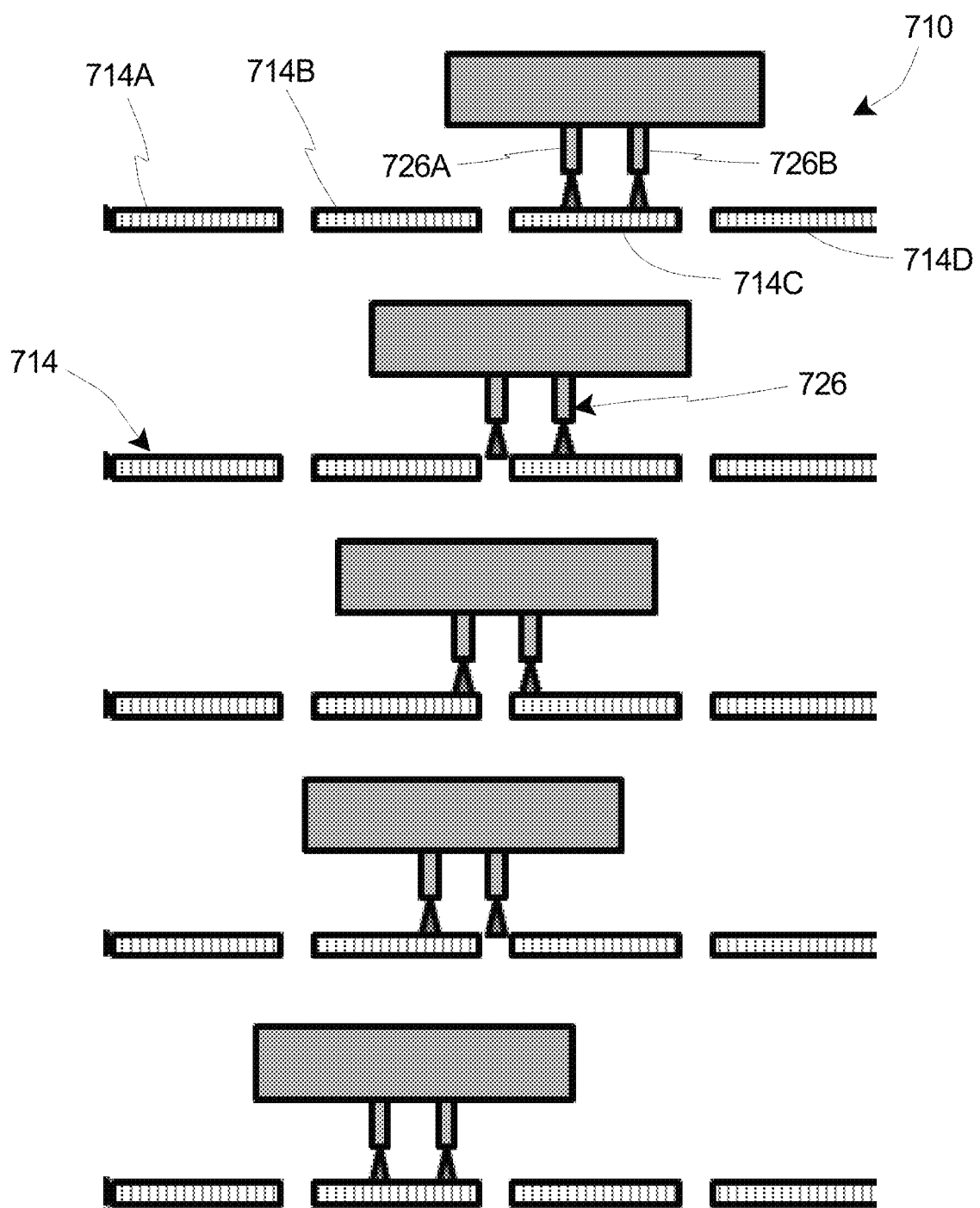
FIG. 7A is a simplified schematic illustration of alternative views of still another embodiment of the position encoder including still yet another embodiment of the target pattern.

7A is a simplified schematic illustration of alternative views of still another embodiment of the position encoder 710 including still yet another embodiment of the target pattern 714. More particularly, as shown in FIG. 7A, the position encoder 710 can include multiple spaced apart image sensors 726, e.g., a first image sensor 726A and a second image sensor 726B as shown in FIG. 7A. Additionally, as noted above, the target pattern 714 can be a tile-based target pattern. In FIG. 7A, the target pattern 714 is illustrated as including four patterned tiles, i.e. a first patterned tile 714A, a second patterned tile 714B, a third patterned tile 714C and a fourth patterned tile 714D. In one embodiment, each of the patterned tiles 714A-714D is substantially rectangle-shaped. Alternatively, each of the patterned tiles 714A-714D can have another suitable shape.

It is appreciated that the illustration of two image sensors 726 in FIG. 7A is purely for purposes of demonstration, and the position encoder 710 can include greater than two image sensors 716. Additionally, it is further appreciated that the illustration of four patterned tiles in FIG. 7A is purely for purposes of demonstration, and the target pattern 714 can include greater than four or less than four patterned tiles.

As provided herein, the image sensor of the position encoder must be looking at a target pattern of precisely printed configurations to provide the desired position/movement information. The range that the image sensor can sense is dictated by how large a target pattern can be produced. In certain applications, e.g., for a large range of travel, a target pattern of sufficient size can be somewhat difficult to produce. As demonstrated in FIG. 7A, the problem of cost associated with manufacturing a large target pattern and sensing over a large range for the position encoder is solved by use of multiple image sensors and multiple, small, inexpensive patterned tiles to form the overall target pattern.

Thus, with reference to FIG. 7A, the position encoder 710 can incorporate multiple image sensors 726A, 726B to overcome a problem associated with using multiple patterned tiles 714A-714D to form the overall target pattern 714. In particular, FIG. 7A provides a simplified schematic illustration of how utilizing multiple image sensors 726A, 726B with in the position encoder 710 can effectively monitor position in one dimension when the target pattern 714 is formed from multiple patterned tiles 714A-714D. Conversely, for a single image sensor system, when the image sensor is looking at the center of the tile, everything works great. However, a problem occurs when the image sensor passes from one tile over to another tile. For example, the target pattern might not run perfectly to the edge of the tile; so there would be a region of no pattern and therefore no sensing. Additionally, a gap may exist between adjacent tiles, much like a tile floor, which would also result in a region of no detectable pattern.

It is noted that FIG. 7A illustrates the two spaced apart image sensors 726A, 726B and the four patterned tiles 714A-714D of the target pattern 714 at five different, relative positions. Additionally, FIG. 7A illustrates that the image sensors 726A, 726B are spaced apart sufficiently so that at all times at least one image sensor 726A, 726B is not looking at the gap between adjacent patterned tiles 714A-714D during the relative movement. Thus, at least one image sensor 726A, 726B is imaging a detectable pattern at all times.

In summary, with reference to FIG. 7A, the problem of limited measurement range is solved by utilizing multiple image sensors 726A, 726B that are spaced sufficiently apart from one another. As provided above, FIG. 7A illustrates five different relative positions between the image sensors 726A, 726B and the four patterned tiles 714A-714D of the target pattern 714. For travel in one dimension, (e.g., back and forth in FIG. 7A), (i) for the first relative position (upper most) of FIG. 7A, both the first image sensor 726A and the second image sensor 726B are capturing images of the third patterned tile 714C; (ii) for the second relative position (second highest) of FIG. 7A, the first image sensor 726A is imaging the gap between the second patterned tile 714B and the third patterned tile 714C, while the second image sensor 726B is still capturing images of the third patterned tile 714C; (iii) for the third relative position (third highest) of FIG. 7A, the first image sensor 726A is imaging the second patterned tile 714B, while the second image sensor 726B is still capturing images of the third patterned tile 714C; (iv) for the fourth relative position (second from the bottom) of FIG. 7A, the first image sensor 726A is imaging the second patterned tile 7148, while the second image sensor 726B is imaging the gap between the second patterned tile 714B and the third patterned tile 714C; and (v) for the fifth relative position (lowest) of FIG. 7A, the first image sensor 726A is imaging the second patterned tile 714B, and the second image sensor 726B is also capturing images of the second patterned tile 714B. In certain embodiments, the second image sensor 726B is calibrated to the first image sensor 726A in preparation of the possibility of the loss of either sensor signal.

As provided herein, an advantage that can be realized using the position encoder 710 of FIG. 7A is that the target pattern 714 can be manufactured relatively cheaply, and the patterned tiles 714A-714D can cover very large surfaces for a large operational range for the position encoder 710. Additionally, the position encoder 710 of FIG. 7A also adds a bit of robustness in the event of damage or defects that may be present in the target pattern 714.

It is appreciated that when square patterned tiles are utilized, and when it is desired to detect position and motion in both the X and Y directions, three or more, spaced apart image sensors can be utilized. This is desired as there are now points where there are gaps between the patterned tiles in two directions that the image sensors could be passing over, and there is a need that at least one of the image sensors is not imaging one of the gaps between the patterned tiles at any given time.

Figure 7B:
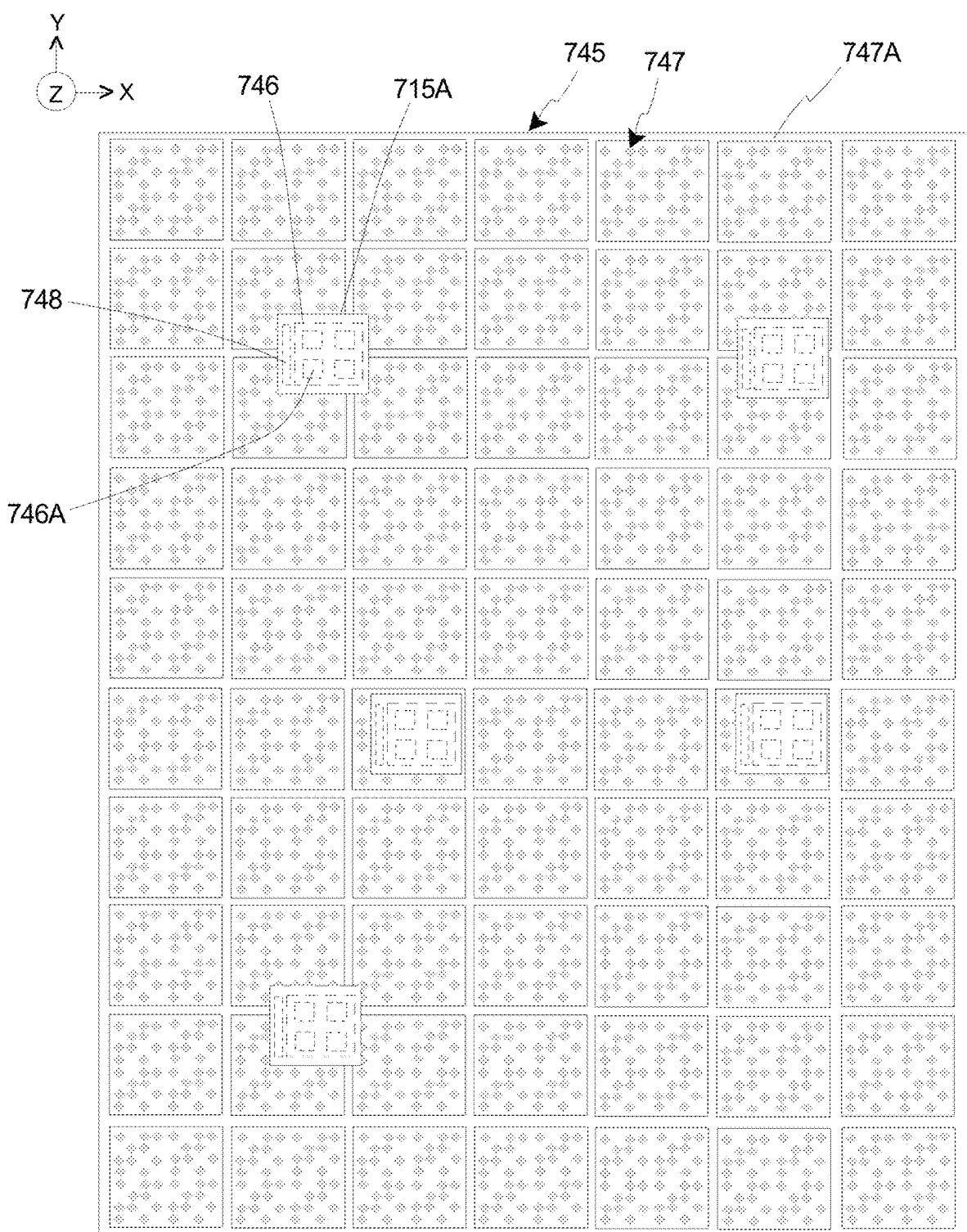
FIG. 7B is a simplified schematic top view illustration of an embodiment of a position encoder system having features of the present invention, the position encoder system including a plurality of image sensor assemblies and yet another embodiment of the target pattern.

FIG. 7B is a simplified schematic top view illustration of an embodiment of a position encoder system 745 having features of the present invention. As shown, the position encoder system 745 includes a plurality of image sensor assemblies 746 (illustrated in phantom) and yet another embodiment of the target pattern 747. Additionally, as shown, each of the image sensor assemblies 746 can be coupled to an object 715A such as a movable cart. The movable cart 715A is movable with a mover assembly 748 (e.g. an electric motor) relative to the target pattern 747. Further, the target pattern 747 may be coupled to and/or incorporated into an object, e.g., a large factory or industrial floor.

In this embodiment, similar to what was shown in FIG. 7A, the target pattern 747 includes a plurality of patterned tiles 747A that are positioned adjacent to one another to form the overall target pattern 747. The target pattern 747 can include any suitable number of patterned tiles 747A. For example, it is understood that due to the difficulty in producing overly large patterned tiles, a large factory or industrial floor can require many, many patterned tiles in order to generate the overall target pattern 747. In the specific example shown in FIG. 7B, the target pattern 747 is formed from seventy individual patterned tiles 747A that are substantially square-shaped and are arranged in a seven-by-ten array. Alternatively, the target pattern 747 can include greater than seventy or less than seventy individual patterned tiles 747A. Still alternatively, the patterned tiles 747A can be positioned in another suitable manner in order to effectively cover the surface to which they are affixed, or to create the surface relative to which position and movement are to be monitored.

It is appreciated that each individual patterned tile 747A can include more individual features or symbols than what is specifically illustrated in FIG. 7B. Additionally, it is further appreciated that the individual features or symbols can be smaller than what is shown in FIG. 7B. The size and number of features or symbols shown within the patterned tiles 747A and the target pattern 747 are for purposes of clarity and ease of illustration.

As with the previous embodiment, each image sensor assembly 746 can include a plurality of image sensors 746A (illustrated in phantom) in order to effectively monitor position relative to the target pattern 747. Moreover, when it is desired to monitor movement or position in two-dimensions (e.g., in the X and Y directions) relative to a target pattern 747 that is formed from a plurality patterned tiles 747A, each sensor assembly 746 can be configured to include four individual image sensors 746A. In most such instances, the inclusion of four image sensors 746A for each image sensor assembly 746 enables at least one of the image sensors 746A to be capturing an image of one of the patterned tiles 747A at all times, i.e. not all four image sensors 746A should be positioned within a gap or capturing an image of a gap between the patterned tiles 747A at any given time. However, in some applications, it may be desired to know and monitor rotational orientation in addition to position in at least the X and Y directions. If only one image sensor 746A is capturing an image of the target pattern 747, i.e. one of the patterned tiles 747A, at any given time, then the rotational position or orientation may not be known. Accordingly, in certain embodiments, to better ensure that rotational orientation can also be effectively monitored, it can be desired that each image sensor assembly 746 includes five individual image sensors 746A.

Additionally, when it is desired to properly position a number of devices, e.g., robots for industrial applications, along the large floor that includes the target pattern 747, it can be desired to include a plurality of image sensor assemblies 746 as part of the position encoder system 745. Each individual image sensor assembly 746 can be utilized for ensuring the proper positioning and/or movement of one or more of such devices around the factory floor. In the embodiment illustrated in FIG. 7B, the position encoder system 745 includes five image sensor assemblies 746. Alternatively, the position encoder system 745 can include greater than five or less than five image sensor assemblies 746.

Figure 8:
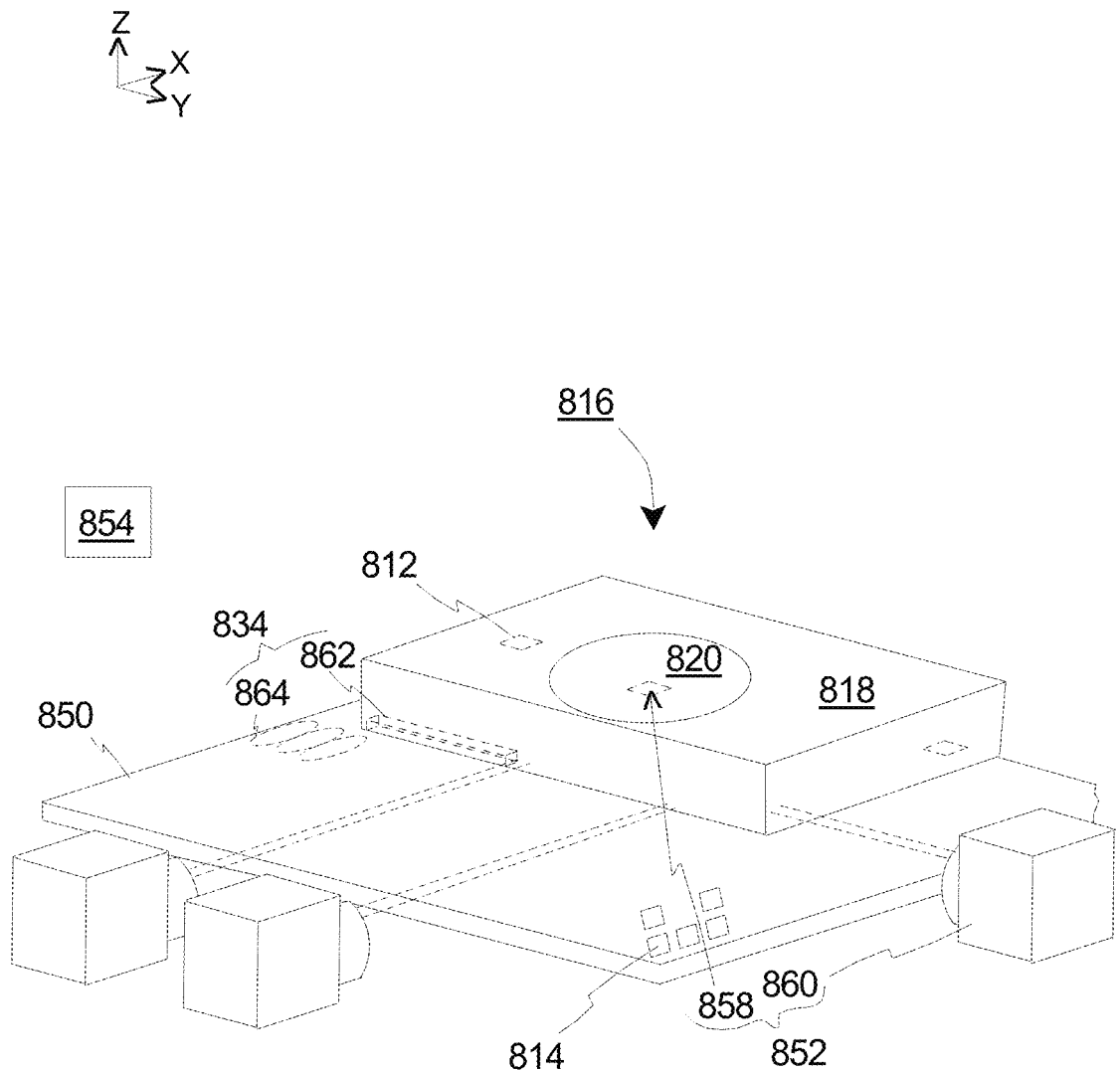
FIG. 8 is a simplified perspective view of a stage assembly having features of the present invention that can utilize the position encoder.

As noted herein above, in certain applications, in addition to its potential use as a standalone position encoder, any of the embodiments of the position encoder disclosed herein can be utilized as part of a stage assembly that positions or moves a device. For example, as illustrated, FIG. 8 is a simplified perspective illustration of a stage assembly 816 that includes a base 850, a stage 818 that retains a device 820, a stage mover assembly 834 (only a portion is illustrated in phantom), a measurement system 852, and a control system 854 (illustrated as a box). The design of each of these components can be varied to suit the design requirements of the stage assembly 816. The stage assembly 816 is particularly useful for precisely positioning the device 820 during a manufacturing and/or an inspection process. The type of device 820 positioned and moved by the stage assembly 816 can be varied. For example, the device 820 can be a semiconductor wafer, or a reticle, and the stage assembly 816 can be used as part of an exposure apparatus 956 (illustrated in FIG. 9) for precisely positioning the wafer or the reticle during manufacturing of the semiconductor wafer. Alternatively, for example, the stage assembly 816 can be used to move other types of devices during manufacturing and/or inspection, to move a device under an electron microscope (not shown), or to move a device during a precision measurement operation (not shown).

As provided herein, in certain embodiments, the measurement system 852 utilizes both a first sensor system 858 (only a portion is illustrated in phantom), and a second sensor system 860 (only a portion is shown in the Figures) that cooperate to monitor the position of the stage 818. The second sensor system 860 is of a different design and/or type than the first sensor system 858. In certain embodiments, the first sensor system 858 has a first sensor accuracy that is less than a second sensor accuracy of the second sensor system 860. It is understood that the various position encoders illustrated and described herein above can be effectively utilized as either the first sensor system 858 or the second sensor system 860. Alternatively, the measurement system 852 can utilize only a single sensor system, which can be a position encoder such as was illustrated and described above, or another type of sensor system.

Additionally, in certain embodiments, the second sensor system 860 is used in the primary control of the stage mover assembly 834. Further, in certain embodiments, the first sensor system 858 can be used during system initialization and/or when the signal from the second sensor system 860 is lost. Many times during initialization of the stage assembly 816, the angle of the stage 818 is too much to get an accurate measurement with the second sensor system 860. Further, water, dust particles, or other environmental factors can block the signal from the second sensor system 860, or the stage 818 can be moved out of the range of the second sensor system 860. At these times, the first sensor system 858 can be used to control the stage mover assembly 834. Further, the first sensor system 858 can be used when less accuracy is required.

Still further, in certain embodiments, the stage assembly 816 must operate over large areas, but high-precision placement is not necessary over the full range of travel. Thus, in such embodiments, (i) the first sensor system 858 can be used to provide position/movement feedback to control the stage mover assembly 834 in the regions where high precision is not necessary and/or where the second sensor system 860 may not be available, and (ii) the second sensor system 860 can be used to provide position/movement feedback to control the stage mover assembly 834 in the regions where high precision is necessary.

Moreover, in certain embodiments, the second sensor system 860 can be used to improve the accuracy of the first sensor system 858. For example, the second sensor system 860 can be used to calibrate the first sensor system 858.

In the embodiments illustrated herein, the stage assembly 816 includes a single stage 818 that retains the device 820. Alternatively, for example, the stage assembly 816 can be designed to include multiple stages that are independently moved and monitored with the measurement system 852.

The base 850 is coupled to the stage mover assembly 834, receives the reaction forces generated by the stage mover assembly 834, and can be any suitable structure. In FIG. 8, the base 850 is generally rectangular-shaped and is rigid. In certain embodiments, the base 850 can be a reaction assembly that counteracts, reduces and minimizes the influence of the reaction forces from the stage mover assembly 834 on the position of other structures. For example, the base 850 can be a rigid, rectangular-shaped countermass that is maintained above a countermass support (not shown) with a reaction bearing (not shown) that allows for motion of the base 850 relative to the countermass support along the X axis, along the Y axis and about the Z axis. For example, the reaction bearing can be a vacuum preload-type fluid bearing, a magnetic-type bearing, or a roller bearing-type assembly. Alternatively, for example, the stage assembly 816 can include a reaction frame (not shown), that couples the stage mover assembly 834 to the base 850 or another structure.

With the present design, (i) movement of the stage 818 with the stage mover assembly 834 along the X axis, generates an equal and opposite X reaction force that moves the base 850 in the opposite direction along the X axis; (ii) movement of the stage 818 with the stage mover assembly 834 along the Y axis, generates an equal and opposite Y reaction force that moves the base 850 in the opposite direction along the Y axis; and (iii) movement of the stage 818 with the stage mover assembly 834 about the Z axis generates an equal and opposite theta Z reaction moment (torque) that moves the base 850 about the Z axis. Additionally, any motion of the stage 818 with respect to the base 850 when away from the center of mass of the base 850 will tend to produce a reaction moment in the Z direction on the base 850 that will tend to rotate the base 850 about the Z axis.

The stage 818 retains the device 820. In one embodiment, the stage 818 is precisely moved by the stage mover assembly 834 to precisely position the stage 818 and the device 820. In FIG. 8, the stage 818 is generally rectangular-shaped and includes a device holder (not shown) for retaining the device 820. The device holder can be a vacuum chuck, an electrostatic chuck, or some other type of clamp.

The design of the stage mover assembly 834 can be varied to suit the movement requirements of the stage assembly 816. In the non-exclusive embodiment illustrated in FIG. 8, the stage mover assembly 834 is a planar motor that moves the stage 818 along the X, Y, and Z axes, and about the X, Y, and Z axes (six degrees of freedom). In this embodiment, the first sensor system 858 monitors the movement or position of the stage 818 along the X, Y, and Z axes, and about the X, Y, and Z axes (six degrees of freedom); and the second sensor system 860 monitors the movement or position of the stage 818 along the X, Y, and Z axes, and about the X, Y, and Z axes (six degrees of freedom).

Alternatively, the stage mover assembly 834 can be designed to only move the stage 818 along the X and Y axes, and about Z axis (planar degrees of freedom). In such embodiment, the first sensor system 858 and the second sensor system 860 would each monitor the movement of the stage 818 along the X and Y axes, and about Z axis.

In FIG. 8, the stage mover assembly 834 is a planar motor that includes a magnet assembly 862 (only a portion is illustrated in phantom) that includes a plurality of spaced apart magnets (not shown), and a conductor assembly 864 (only a portion is illustrated in phantom) that includes a plurality of conductor units (not shown). Alternatively, for example, the stage mover assembly 834 can include one or more linear actuators, voice coil movers, or other types of actuators.

The measurement system 852 monitors the movement and/or the position of the stage 818 relative to a reference, such as an optical assembly 966 (illustrated in FIG. 9) of the exposure apparatus 956. With this information, the stage mover assembly 834 can be controlled by the control system 854 to precisely position the stage 818. As provided herein, in certain embodiments, the measurement system 852 utilizes (i) the first sensor system 858 that monitors the movement and/or position of the stage 818, and (ii) the second sensor system 860 that also monitors the movement and/or position of the stage 818. The design of the measurement system 852 can be varied according to the movement requirements of the stage 818.

The sensor systems 858, 860 can vary. In the embodiment illustrated in FIG. 8, the second sensor system 860 is a laser interferometer system. Alternatively, the second sensor system 860 can be an encoder assembly that includes one or more encoders that monitor the movement of the stage 818 along and about the first, second and third axes. Still alternatively, the second sensor system 860 can be an embodiment of a position encoder such as was illustrated and described herein above.

Further, in this embodiment, the first sensor system 858 is a position encoder similar to one or more of the embodiments illustrated and describe above. More particularly, as shown in FIG. 8, the first sensor system 858 includes a plurality of spaced apart image sensor assemblies 812 (illustrated as a box in phantom) that are fixedly attached to and/or integrated into the bottom of the stage 818, and a target pattern 814 (only a portion of which is shown in FIG. 8) that is secured to or formed within an upper surface of the base 850. With this design, the image sensor assemblies 812 with the stage 818 move relative to the base 850. Alternatively, in one embodiment, the target pattern 814 can be secured to or formed within a bottom surface of the stage 818, and the image sensor assemblies 812 can be fixedly attached to and/or integrated into the base 850.

The number and design of the image sensor assemblies 812 can vary. For example, in FIG. 8, each image sensor assembly 812 is able to monitor movement along at least the X and Y axes. Thus, three or more image sensor assemblies 812 may be needed to provide monitoring of the full movement of the stage 818 along the X, Y, and Z axes, and about the X, Y, and Z axes.

Further, if the first sensor system 858 only monitors movement of the stage 818 relative to the base 850, another measurement system (not shown) may be necessary to monitor movement of the base 850 relative to the optical assembly 966 or another reference. However, in some embodiments, the first sensor system 858 itself can also be used to monitor movement of the base 850 relative to the optical assembly 966 or another reference. Further, the first sensor system 858 provided herein can be used in another type of stage assembly.

The control system 854 is electrically connected to the measurement system 852, and utilizes the information from the first sensor system 858 and the second sensor system 860 to monitor and determine movement of the stage 818. For example, the control system 854 can utilize the second sensor signals from the second sensor system 860 and/or the first sensor signals from the first sensor system 858 to monitor the movement of the stage 818. The control system 854 is also electrically connected to, directs and controls electrical current to the stage mover assembly 834 to precisely position the device 820. With information regarding the movement or position of the stage 818, the control system 854 can direct current to the stage mover assembly 834 so that the stage 818 follows a known, desired trajectory.

The control system 854 can include one or more processors and is programmed to perform one or more of the steps provided herein.

In one non-exclusive embodiment, the stage 818 can initially be controlled in all six degrees of freedom using the signals from the first sensor system 858. In this embodiment, the stage 818 is controlled using the first sensor system 858 to take off slowly with a Z trajectory motion. Next, the stage 818 is controlled to rotate about the X, Y and Z axes using the first sensor system 858 until a good signal is received by the second sensor system 860. Subsequently, the second sensor system 860 is reset. Next, the signals from the second sensor system 860 are used to control the movement of the stage 818 with six degrees of freedom. During operation of the stage assembly 816, the first sensor system 858 can be used to control the stage mover assembly 834 in the event the signal from the second sensor system 860 is lost.

Figure 9:
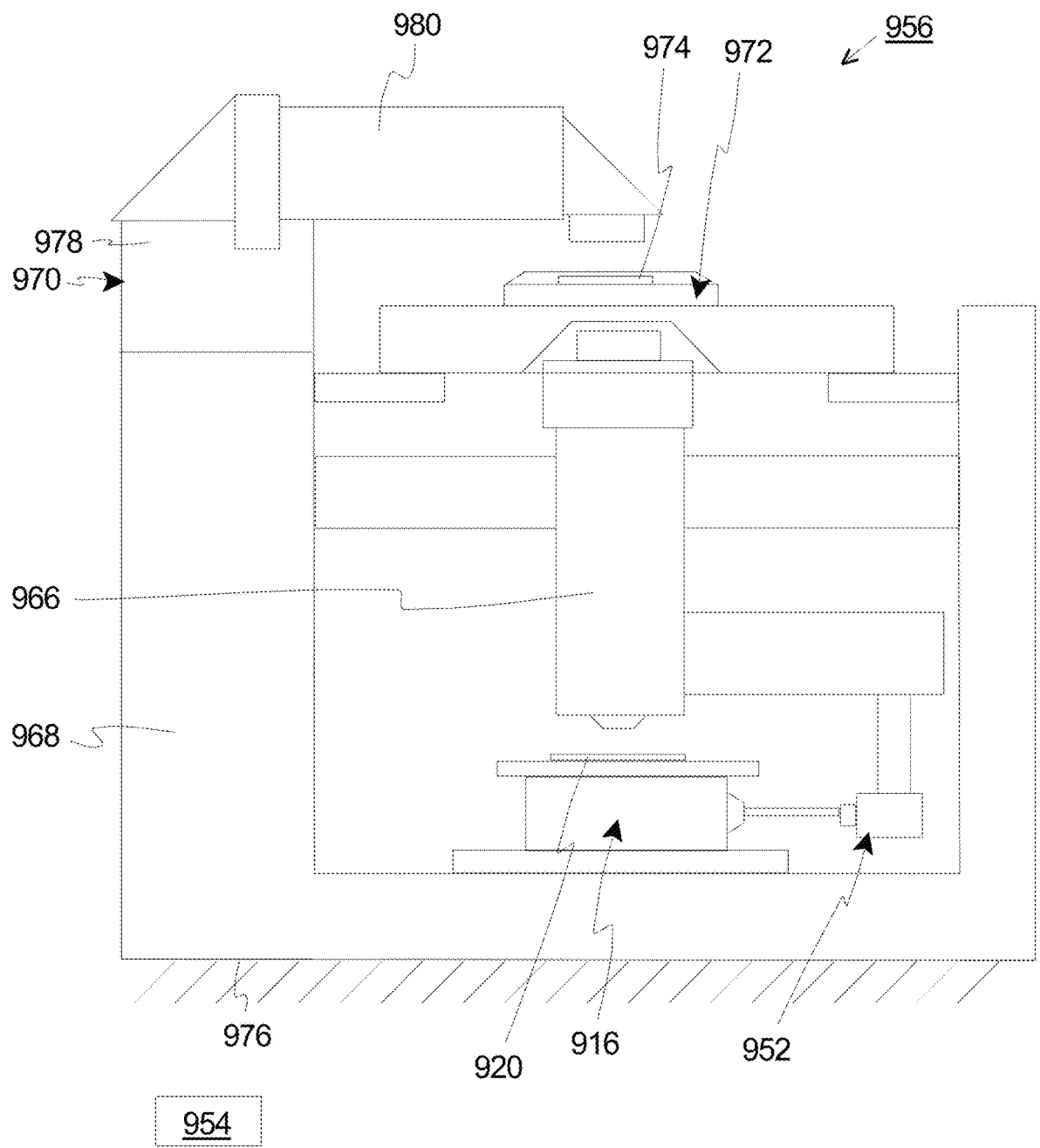
FIG. 9 is a schematic illustration of an exposure apparatus having features of the present invention.

FIG. 9 is a schematic view illustrating an exposure apparatus 956 useful with the present invention. The exposure apparatus 956 includes an apparatus frame 968, a measurement system 952 (only a portion is illustrated in FIG. 9), an illumination system 970 (irradiation apparatus), a reticle stage assembly 972, an optical assembly 966 (lens assembly), a wafer stage assembly 916, and a control system 954 that controls the reticle stage assembly 972 and the wafer stage assembly 916. The stage assembly 816 described in detail herein above in relation to FIG. 8 can be used as the wafer stage assembly 916. Alternatively, with the disclosure provided herein, the stage assembly 816 described in detail herein above in relation to FIG. 8 can be modified for use as the reticle stage assembly 972.

The exposure apparatus 956 is particularly useful as a lithographic device that transfers a pattern (not shown) of an integrated circuit from a reticle 974 onto a semiconductor wafer 920. The exposure apparatus 956 mounts to a mounting base 976, e.g., the ground, a base, or floor or some other supporting structure.

The apparatus frame 968 is rigid and supports the components of the exposure apparatus 956. The design of the apparatus frame 968 can be varied to suit the design requirements for the rest of the exposure apparatus 956.

The illumination system 970 includes an illumination source 978 and an illumination optical assembly 980. The illumination source 978 emits a beam (irradiation) of light energy. The illumination optical assembly 980 guides the beam of light energy from the illumination source 978 to the reticle 974. The beam illuminates selectively different portions of the reticle 974 and exposes the semiconductor wafer 920.

The optical assembly 966 projects and/or focuses the light passing through the reticle 974 to the wafer 920. Depending upon the design of the exposure apparatus 956, the optical assembly 966 can magnify or reduce the image illuminated on the reticle 974.

The reticle stage assembly 972 holds and positions the reticle 974 relative to the optical assembly 966 and the wafer 920. Similarly, the wafer stage assembly 916 holds and positions the wafer 920 with respect to the projected image of the illuminated portions of the reticle 974.

There are a number of different types of lithographic devices. For example, the exposure apparatus 956 can be used as a scanning type photolithography system that exposes the pattern from the reticle 974 onto the wafer 920 with the reticle 974 and the wafer 920 moving synchronously. Alternatively, the exposure apparatus 956 can be a step-and-repeat type photolithography system that exposes the reticle 974 while the reticle 974 and the wafer 920 are stationary.

However, the use of the exposure apparatus 956 is not limited to a photolithography system for semiconductor manufacturing. The exposure apparatus 956, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

It is understood that the same principle of locating the stage with respect to a stage base, countermass, or with respect to a reference frame using the measurement system can be implemented on a moving coil stage as well (in the above embodiments, only a moving magnet stage is illustrated in the Figures).

A photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

It is understood that although a number of different embodiments of the position encoder 10 have been illustrated and described herein, one or more features of any one embodiment can be combined with one or more features of one or more of the other embodiments, provided that such combination satisfies the intent of the present invention.

While a number of exemplary aspects and embodiments of a position encoder 10 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A non-diffraction-based position encoder for monitoring position of an object, the position encoder comprising:
   a non-diffractive target pattern;
   an illumination system that generates (i) a first illumination beam that is directed toward, impinges on and reflects off of the target pattern, the first illumination beam having a first beam characteristic; and (ii) a second illumination beam that is directed toward, impinges on and reflects off of the target pattern, the second illumination beam having a second beam characteristic that is different than the first beam characteristic;

an image sensor that is coupled to the object, the image sensor being spaced apart from the target pattern along a first axis, the image sensor sensing a first set of information from the first illumination beam impinging on the target pattern and sensing a second set of information from the second illumination beam impinging on the target pattern; and a control system that analyzes the first set of information and the second set of information to monitor the position of the object.

2. The position encoder of claim 1 wherein the target pattern includes a plurality of first pattern elements that are reflective to the first illumination beam; and a plurality of second pattern elements that are reflective to the second illumination beam.

3. The position encoder of claim 2 wherein the plurality of first pattern elements are less reflective to the second illumination beam than they are reflective to the first illumination beam; and the plurality of second pattern elements are less reflective to the first illumination beam than they are reflective to the second illumination beam.

4. The position encoder of claim 1 wherein the first beam characteristic is a first wavelength, and the second beam characteristic is a second wavelength that is different than the first wavelength.

5. The position encoder of claim 1 wherein the first beam characteristic is a first polarization, and the second beam characteristic is a second polarization that is different than the first polarization.

6. The position encoder of claim 1 wherein the illumination system includes a first illumination source that generates the first illumination beam and a second illumination source that generates the second illumination beam.

7. The position encoder of claim 6 wherein at least one of the first illumination source and the second illumination source includes a light emitting diode.

8. The position encoder of claim 1 wherein the image sensor includes a one-dimensional array of detector elements that are oriented along a second axis that is perpendicular to the first axis; and wherein the control system determines the position of the object relative to the target pattern along the second axis.

9. The position encoder of claim 1 wherein the image sensor includes a two-dimensional array of detector elements arranged in a plurality of detector columns and a plurality of detector rows.

10. The position encoder of claim 9 wherein the two-dimensional array of detector elements are oriented along a second axis and a third axis that are both perpendicular to the first axis; and wherein the control system determines the position of the object relative to the target pattern along the second axis and along the third axis.

11. The position encoder of claim 9 wherein the image sensor (i) senses information for each of the detector elements from the first illumination beam impinging on the target pattern; and (ii) senses information for each of the detector elements from the second illumination beam impinging on the target pattern.

12. The position encoder of claim 1 further comprising a rotational axis; wherein the image sensor includes an array of detector elements having detector elements that are arranged in one of an arc about the rotational axis and in a line tangential to the rotational axis; and wherein the control system determines the rotational position of the object about the rotational axis relative to the target pattern.

13. The position encoder of claim 12 wherein the array of detector elements further has detector elements that are arranged in one of radially about the rotational axis and perpendicular to the line tangential to the rotational axis; and wherein the control system further determines the radial position of the object relative to the target pattern.

14. The position encoder of claim 12 wherein the rotational axis is perpendicular to the first axis.

15. The position encoder of claim 12 wherein the rotational axis is parallel to the first axis.

16. The position encoder of claim 1 further comprising an optical system that forms an image of the target pattern on the image sensor, the optical system being spaced apart from the target pattern along the first axis.

17. A position encoder for monitoring position of an object, the position encoder comprising:

a target pattern;

an illumination system that generates (i) a first illumination beam that is directed toward and impinges on the target pattern, the first illumination beam having a first beam characteristic; and (ii) a second illumination beam that is directed toward and impinges on the target pattern, the second illumination beam having a second beam characteristic that is different than the first beam characteristic;

an image sensor that is coupled to the object, the image sensor being spaced apart from the target pattern along a first axis, the image sensor including a two-dimensional array of detector elements arranged in a plurality of detector columns and a plurality of detector rows, the image sensor sensing a first set of information for each of the detector elements from the first illumination beam impinging on the target pattern and sensing a second set of information for each of the detector elements from the second illumination beam impinging on the target pattern; and a control system that analyzes the first set of information and the second set of information to monitor the position of the object;

wherein from the first illumination beam impinging on the target pattern, the image sensor individually sums the information for each of the plurality of detector columns to generate a plurality of first summed column outputs, and the image sensor individually sums the information for each of the plurality of detector rows to generate a plurality of first summed row outputs; and wherein from the second illumination beam impinging on the target pattern, the image sensor individually sums the information for each of the plurality of detector columns to generate a plurality of second summed column outputs, and the image sensor individually sums the information for each of the plurality of detector rows to generate a plurality of second summed row outputs.

18. The position encoder of claim 17 wherein the control system analyzes the first summed column outputs, the first summed row outputs, the second summed column outputs and the second summed row outputs to monitor the position of the object.

19. The position encoder of claim 18 wherein the control system includes an algorithm that is configured to determine a phase of each of the first summed column outputs, the first summed row outputs, the second summed column outputs and the second summed row outputs to monitor the position of the object.

20. A position encoder for monitoring position of an object, the position encoder comprising:
a target pattern;
an illumination system that generates (i) a first illumination beam that is directed toward and impinges on the target pattern, the first illumination beam having a first beam characteristic; and (ii) a second illumination beam that is directed toward and impinges on the target pattern, the second illumination beam having a second beam characteristic that is different than the first beam characteristic;
an image sensor that is coupled to the object, the image sensor being spaced apart from the target pattern along a first axis, the image sensor including a two-dimensional array of detector elements arranged in a plurality of detector columns and a plurality of detector rows, the image sensor sensing a first set of information for each of the detector elements from the first illumination beam impinging on the target pattern and sensing a second set of information for each of the detector elements from the second illumination beam impinging on the target pattern; and
a control system that analyzes the first set of information and the second set of information to monitor the position of the object;
wherein from the first illumination beam impinging on the target pattern, the control system individually sums the information for each of the plurality of detector columns to generate a plurality of first summed column outputs, and the control system individually sums the information for each of the plurality of detector rows to generate a plurality of first summed row outputs; and wherein from the second illumination beam impinging on the target pattern, the control system individually sums the information for each of the plurality of detector columns to generate a plurality of second summed column outputs, and the control system individually sums the information for each of the plurality of detector rows to generate a plurality of second summed row outputs.

21. A position encoder for monitoring position of an object, the position encoder comprising:
a target pattern;
an illumination system that generates an illumination beam that is directed toward and impinges on the target pattern;
a plurality of image sensors that are coupled to the object, each of the image sensors being spaced apart from the target pattern along a first axis, each of the image sensors including a two-dimensional array of detector elements arranged in a plurality of detector columns and a plurality of detector rows, each of the image sensors sensing information for each of the detector elements from the illumination beam impinging on the target pattern, each of the image sensors individually summing the information for each of the plurality of detector columns to generate a plurality of summed column outputs, and each of the image sensors individually summing the information for each of the plurality of detector rows to generate a plurality of summed row outputs; and
a control system that analyzes the summed column outputs and the summed row outputs to monitor the position of the object.

22. The position encoder of claim 21 wherein the image sensor includes a controller that is positioned within a body of the image sensor, the controller being configured to individually sum the information for each of the plurality of detector columns to generate the plurality of summed column outputs, and individually sum the information for each of the plurality of detector rows to generate the plurality of summed row outputs.

23. The position encoder of claim 21 wherein the two-dimensional array of detector elements is oriented along a second axis and a third axis that are both perpendicular to the first axis; and wherein the control system determines the position of the object relative to the target pattern along the second axis and along the third axis.

24. The position encoder of claim 21 wherein the object is a movable cart that is selectively moved relative to the target pattern.

25. The position encoder of claim 21 wherein the target pattern includes a plurality of first pattern elements that are arranged in a first pattern, and a plurality of second pattern elements that are arranged in a second pattern that is different than the first pattern.

26. The position encoder of claim 25 wherein the illumination system generates (i) a first illumination beam that is directed toward and impinges on the target pattern; and (ii) a second illumination beam that is directed toward and impinges on the target pattern.

27. The position encoder of claim 26 wherein the plurality of first pattern elements are reflective to the first illumination beam; and wherein the plurality of second pattern elements are reflective to the second illumination beam.

28. The position encoder of claim 26 wherein the first illumination beam has a first beam characteristic and the second illumination beam has a second beam characteristic that is different than the first beam characteristic.

29. The position encoder of claim 21 wherein the target pattern includes a periodic pattern; and wherein the control system uses a relative phase of the periodic pattern and the array of detector elements to calculate an incremental position signal.

30. The position encoder of claim 21 wherein the target pattern includes a non-repeating pattern; and wherein the control system uses information from the non-repeating pattern to calculate an absolute position signal.

31. The position encoder of claim 21 further comprising an optical system that forms an image of the target pattern on the image sensor, the optical system being spaced apart from the target pattern along the first axis.

32. A position encoder for monitoring position of an object, the position encoder comprising:
a target pattern;
an illumination system that generates an illumination beam that is directed toward and impinges on the target pattern;
an image sensor that is coupled to the object, the image sensor being spaced apart from the target pattern along a first axis, the image sensor including a two-dimensional array of detector elements arranged in a plurality of detector columns and a plurality of detector rows, the image sensor sensing information for each of the detector elements from the illumination beam impinging on the target pattern, the image sensor individually summing the information for each of the plurality of detector columns to generate a plurality of summed column outputs, and the image sensor individually summing the information for each of the plurality of detector rows to generate a plurality of summed row outputs; and a control system that analyzes the summed column outputs and the summed row outputs to monitor the position of the object;

wherein the control system includes an algorithm that is configured to determine a phase of the summed column outputs and a phase of the summed row outputs to monitor the position of the object.

33. A position encoder for monitoring position of an object, the position encoder comprising:

a target pattern including a plurality of first pattern elements that are arranged in a first pattern, and a plurality of second pattern elements that are arranged in a second pattern that is different than the first pattern;

an illumination system that generates an illumination beam that is directed toward and impinges on the target pattern;

an image sensor that is coupled to the object, the image sensor being spaced apart from the target pattern along a first axis, the image sensor including a two-dimensional array of detector elements arranged in a plurality of detector columns and a plurality of detector rows, the image sensor sensing a first set of information from the illumination beam impinging on the plurality of first pattern elements and senses a second set of information from the illumination beam impinging on the plurality of second pattern elements; and a control system that analyzes the first set of information and the second set of information to monitor the position of the object;

wherein the control system individually sums the information for each of the plurality of detector columns to generate a plurality of summed column outputs, and individually sums the information for each of the plurality of detector rows to generate a plurality of summed row outputs, the control system analyzing the summed column outputs and the summed row outputs to monitor the position of the object; and wherein the control system includes an algorithm that is configured to determine a phase of the summed column outputs and a phase of the summed row outputs to monitor the position of the object.

34. The position encoder of claim 33 wherein the plurality of first pattern elements are a first color and the plurality of second pattern elements are a second color that is different than the first color.

35. The position encoder of claim 34 wherein the plurality of first pattern elements are integrated together with the plurality of second pattern elements to form the target pattern.

36. The position encoder of claim 34 wherein the target pattern further includes a plurality of third pattern elements that are arranged in a third pattern that is different than the first pattern and the second pattern.

37. The position encoder of claim 33 wherein the first pattern includes a periodic pattern; and wherein the control system uses a relative phase of the periodic pattern and the array of detector elements to calculate an incremental position signal.

38. The position encoder of claim 33 wherein the first pattern includes a non-repeating pattern; and wherein the control system uses information from the non-repeating pattern to calculate an absolute position signal.

39. The position encoder of claim 33 wherein the first pattern includes a plurality of spaced apart first parallel lines and the second pattern includes a plurality of spaced apart second parallel lines that at least partially overlaps the first parallel lines.

40. The position encoder of claim 39 wherein the first parallel lines are spaced apart from one another by a first spacing, and wherein the second parallel lines are spaced apart from one another by a second spacing that is different than the first spacing.

41. The position encoder of claim 33 wherein the first pattern includes a plurality of spaced apart first curved lines, and the second pattern includes a plurality of spaced apart second curved lines, wherein the first curved lines have a first curve frequency and the second curved lines have a second curve frequency, and wherein the first curve frequency is different from the first curve frequency.

42. The position encoder of claim 33 wherein the illumination system generates (i) a first illumination beam that is directed toward and impinges on the target pattern; and (ii) a second illumination beam that is directed toward and impinges on the target pattern; and wherein the plurality of first pattern elements are reflective to the first illumination beam, and the plurality of second pattern elements are reflective to the second illumination beam.

43. The position encoder of claim 42 wherein the first illumination beam has a first beam characteristic and the second illumination beam has a second beam characteristic that is different than the first beam characteristic.

44. The position encoder of claim 33 further comprising an optical system that forms an image of the target pattern on the image sensor, the optical system being spaced apart from the target pattern along the first axis.

* * * * *

UNITED STATES PATENT AND TRADEMARK OFFICE
CERTIFICATE OF CORRECTION

PATENT NO. : 11,061,338 B2  
APPLICATION NO. : 15/940549  
DATED : July 13, 2021  
INVENTOR(S) : Jonathan Kyle Wells et al.

Page 1 of 1

It is certified that error appears in the above-identified patent and that said Letters Patent is hereby corrected as shown below:

In the Claims

Column 40, Line 32, "first" should be changed to --second--.

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*